United States Patent
Kim et al.

(10) Patent No.: US 8,420,989 B2
(45) Date of Patent: Apr. 16, 2013

(54) COIL AND SEMICONDUCTOR APPARATUS HAVING THE SAME

(75) Inventors: Minill Kim, Cheonan-si (KR); Kwang Yong Lee, Anyang-si (KR); Jonggi Lee, Yongin-si (KR); Ji-Seok Hong, Seoul (KR); Hyun jeong Woo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 589 days.

(21) Appl. No.: 12/615,507

(22) Filed: Nov. 10, 2009

(65) Prior Publication Data

US 2010/0117213 A1    May 13, 2010

(30) Foreign Application Priority Data

Nov. 11, 2008 (KR) .................. 10-2008-0111393
Jul. 7, 2009 (KR) .................. 10-2009-0061735

(51) Int. Cl.
*H05B 6/10* (2006.01)
(52) U.S. Cl.
USPC ........................ 219/635; 219/638; 219/15
(58) Field of Classification Search .......... 219/616, 219/622, 623, 632, 635, 638, 660, 444.1, 219/501
See application file for complete search history.

(56) References Cited

U.S. PATENT DOCUMENTS

| | | | |
|---|---|---|---|
| 4,909,429 A * | 3/1990 | Ankrom et al. | 228/57 |
| 5,222,649 A * | 6/1993 | Funari et al. | 228/6.2 |
| 5,358,166 A * | 10/1994 | Mishina et al. | 228/42 |
| 5,467,912 A * | 11/1995 | Mishina et al. | 228/10 |
| 6,288,376 B1 * | 9/2001 | Tsumura | 219/635 |
| 6,878,172 B2 * | 4/2005 | Jensen | 29/25.01 |
| 8,113,141 B2 * | 2/2012 | Oh | 118/320 |
| 2007/0023486 A1 | 2/2007 | Matsuura et al. | |

FOREIGN PATENT DOCUMENTS

| | | |
|---|---|---|
| JP | 2000260826 | 9/2000 |
| JP | 2004288946 | 10/2004 |
| JP | 2007036110 | 2/2007 |
| JP | 2007142343 | 6/2007 |
| JP | 2008141118 | 6/2008 |
| KR | 20040067048 | 7/2004 |
| KR | 20080043401 | 5/2008 |

* cited by examiner

*Primary Examiner* — Sheila V. Clark
(74) *Attorney, Agent, or Firm* — Stanzione & Kim, LLP

(57) ABSTRACT

An apparatus to package a semiconductor chip includes a coil configured to use induction heating to reflow a solder ball of the semiconductor chip. The coil includes a first body, a second body parallel to the first body, a third body extending from the first body to the second body. The first and second bodies are symmetrical with respect to a vertical plane disposed therebetween. The first and second bodies have inclined surfaces facing each other, and the inclined surfaces are distant from each other downward.

4 Claims, 26 Drawing Sheets

COIL AND SEMICONDUCTOR APPARATUS HAVING THE SAME

CROSS-REFERENCE TO RELATED APPLICATIONS

This application claims priority under 35 U.S.C. §119 (a) from Korean Patent Application Nos. 10-2008-0111393, filed on Nov. 11, 2008, and 10-2009-0061735, filed on Jul. 7, 2009, the disclosures of which are incorporated herein by reference in its entirety.

BACKGROUND

1. Field of the Invention

The present general inventive concept relates to a coil of a package apparatus to package a semiconductor chip, which is adapted for induction heating of a solder ball.

2. Description of the Related Art

A process to package a semiconductor chip includes an assembly process and a mounting process. The assembly process provides a solder ball to a semiconductor chip, which functions as a terminal for an electrical connection with an external electrical device. The mounting process mounts the semiconductor chip having the solder ball on a printed circuit board (PCB).

After the assembly and mounting processes, a process to reflow the solder ball by applying heat on each solder ball is required.

SUMMARY OF THE INVENTION

The present general inventive concept provides a coil of a package apparatus to package a semiconductor chip, which is adapted for induction heating of a solder ball.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by coils used to reflow a solder ball, the coils including a first body having a longitudinal direction as a first direction, a second body spaced apart from the first body in a second direction perpendicular to the first direction, the second body having a longitudinal direction as the first direction, and a third body connecting the first body to the second body, wherein the first body and the second body have inclined surfaces facing each other, and the inclined surfaces are generally more distant from each other in a direction toward a bottom of the coil.

The first and second bodies may be symmetrical with each other with respect to a plane that is perpendicular to the second direction and that is disposed between the first and second bodies.

The first body may include a top portion and bottom portion, the bottom portion may protrude downward from an inner region of the top portion adjacent to the second body, and the inclined surface is provided to the bottom portion.

The bottom portion may have a lower end that is lower than a bottom surface of the top portion.

The bottom portion of the first body may be provided in plurality, and the bottom portions are spaced apart from each other in the longitudinal direction of the first body.

At least two of the bottom portions of the first body may have downward protruding lengths that are different from each other.

At least two of the bottom portions of the first body may have bottom surfaces, heights of which are different from each other.

The first body may have a top surface, a first inner surface, a second inner surface, a third inner surface, a first bottom surface, a first outer surface, a second bottom surface, and a second outer surface that are sequentially and continuously arranged, wherein the first inner surface, the second inner surface, and the third inner surface may face the second body, the top surface, the first bottom surface, and the second bottom surface may be approximately parallel to each other, the second inner surface, the first outer surface, and the second outer surface may be approximately parallel to each other, the top surface may be approximately perpendicular to the second inner surface, a lower end of the third inner surface may be lower than the second bottom surface, and the third inner surface may be provided as the inclined surface.

The first body may have a cross section perpendicular to the first direction, and the cross section may include an approximate right angled triangle shape that has the inclined surface.

The first body may have a top surface, an inner surface, a first outer surface, a bottom surface, and a second outer surface that are sequentially and continuously arranged, wherein the top surface and the bottom surface may be approximately parallel to each other, the first outer surface and the second outer surface may be approximately parallel to each other, the top surface may be approximately perpendicular to the first outer surface, the inner surface may be provided as the inclined surface, and a lower end of the inner surface may be lower than the bottom surface.

The foregoing and/or other aspects and utilities of the general inventive concept may also be achieved by a heating member to heat solder balls of a semiconductor chip to reflow the solder ball, the heating member including a power source to provide heat to the heating member, a cooling line to cool the heating member, and a coil, the coil including a main body having a top surface and a bottom surface that are parallel to each other, and an inner surface provided between the top surface and the bottom surface and perpendicular to the top and bottom surfaces.

The bottom surface may include a bottom portion at the opposite sides of the main body to protrude in a downward direction from the bottom surface.

The bottom surface may include a plurality of bottom portions spaced apart from each other, each of the bottom portions to protrude in a downward direction from the bottom surface.

At least two of the bottom portions may have downward protruding lengths that are different from each other.

At least two of the bottom portions may have widths that are different from each other.

The inner surface may be gradually inclined in an upward direction from the bottom surface toward the top surface.

The inner surface may include an inclined portion, a middle portion, and a declined portion, the inclined portion being gradually inclined in an upward direction from the bottom surface toward the top surface, the middle portion being provided between the inclined portion and the declined portion and perpendicular to the top and bottom surfaces, and the declined portion being gradually declined in a downward direction from the middle portion to a lower protruding end of the bottom surface.

The foregoing and/or other aspects and utilities of the general inventive concept may also be achieved by a semiconductor apparatus including a circuit board having at least one passive device and at least one semiconductor chip with solder balls mounted thereon the circuit board, and a heating member to heat the solder balls of the semiconductor chip to reflow the solder balls, the heating member including a coil having a main body with a top surface and a bottom surface that are parallel to each other, and an inner surface provided between the top surface and the bottom surface and perpendicular to the top and bottom surfaces.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
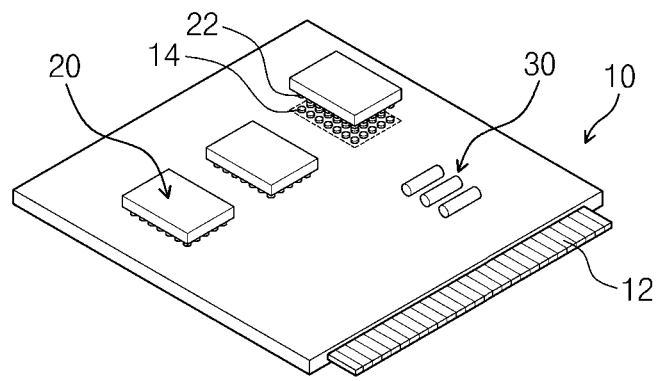
FIG. 1 is a perspective view illustrating a printed circuit board to which a semiconductor chip is mounted, according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a schematic view illustrating a printed circuit board 10 to which semiconductor chips 20 are mounted according to an embodiment of the present general inventive concept. The printed circuit board 10, having a thin plate shape, includes connection terminals 12 at a side surface to electrically connect an external electronic device (not shown). An upper surface of the printed circuit board 10 is provided with connection terminals such as pads 14 that are electrically connected to the semiconductor chips 20. The semiconductor chip 20 includes solder balls 22 that contact onto the pad 14. The connection terminals 12 at the side surface of the printed circuit board 10 are electrically connected to the pads 14 through a plurality of conductive lines (not shown) formed at the printed circuit board 10.

Figure 2:
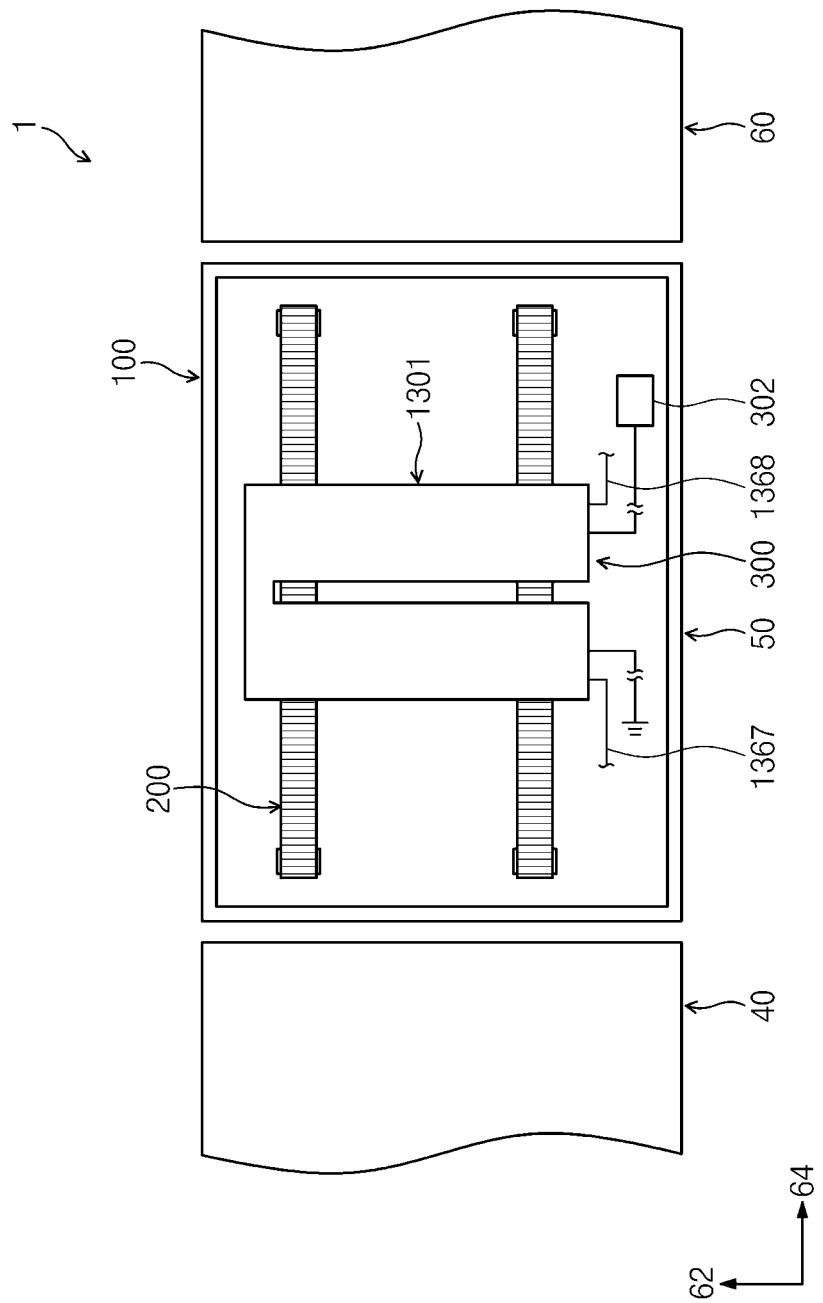
FIG. 2 is a plan view illustrating a package apparatus according to an embodiment of the present general inventive concept.

FIG. 2 is a plan view illustrating a package apparatus 1 according to an embodiment of the present general inventive concept. The package apparatus 1 includes a first unit 40, a second unit 50, and a third unit 60. The second unit 50 heats the solder balls 22 of the semiconductor chip 20 mounted on the printed circuit board 10 to perform a reflow process on the solder balls 22. The first unit 40 may be a loader unit that loads the printed circuit board 10 provided with the semiconductor chips 20 to the second unit 50. The third unit 60 may be an unloader unit that unloads the printed circuit board 10 after the reflow process from the second unit 50 to the outside. Alternatively, the first unit 40 or the third unit 60 may be a unit to perform a package process with the second unit 50 in an in-line manner. For example, the first unit 40 may be a unit that mounts the semiconductor chip 20 on the printed circuit board 10.

Figure 3:
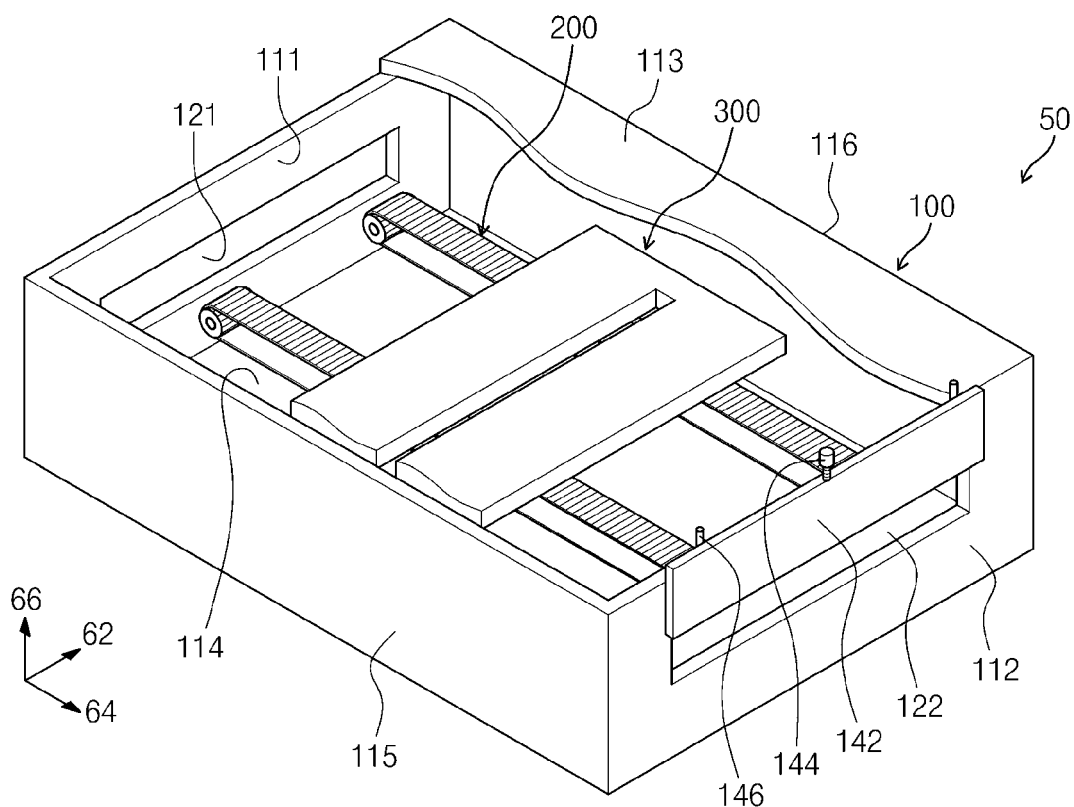
FIG. 3 is a perspective view illustrating the structure of a second unit of FIG. 2.

The first unit 40, the second unit 50, and the third unit 60 may be sequentially arranged in one direction. Hereinafter, a first direction 62 denotes a perpendicular direction to a direction in which the first unit 40, the second unit 50, and the third unit 60 are arranged, and a second direction 64 denotes the direction in which the first unit 40, the second unit 50, and the third unit 60 are arranged. A third direction 66 as shown in FIG. 3 denotes a perpendicular direction to the first and second directions 62 and 64. A plane defined by the first and second directions 62 and 64 is approximately parallel to a surface of the printed circuit board 10 placed on a conveyor 220 shown FIG. 4.

Hereinafter, a structure of the second unit 50 will now be described in detail. FIG. 3 is a perspective view illustrating the structure of the second unit 50. The second unit 50 includes a housing 100, a substrate supporting member 200, and a heating member 300. The housing 100 has an approximate rectangular parallelepiped shape. The substrate supporting member 200 and the heating member 300 are installed in the housing 100. The housing 100 is formed of metal to prevent electro magnetic interference from the outside. For example, the housing 100 may be formed of aluminum. A longitudinal direction of the housing 100 is the second direction 64. The housing 100 includes a front wall 111, a rear wall 112, an upper wall 113, a lower wall 114, a first sidewall 115, and a second sidewall 116. The front wall 111 faces the first unit 40, and the rear wall 112 faces the third unit 60. The front wall 111 is provided with an entrance 121 that functions as a passage through which the printed circuit board 10 is loaded into the housing 100. The rear wall 112 is provided with an exit 122 that functions as a passage through which the printed circuit board 10 is unloaded from the housing 100. The front wall 111 is provided with a shutter (not shown) that opens and closes the entrance 121. The rear wall 112 is provided with a shutter 142 that opens and closes the exit 122. The shutter 142 vertically moves along a straight line through a cylinder 44. Guides 146 may be provided to the front wall 111 and the rear wall 112 to guide the straight line motion of the shutter 142. The shutter 142 is formed of metal, such as aluminum, to prevent electro magnetic interference.

Figure 4:
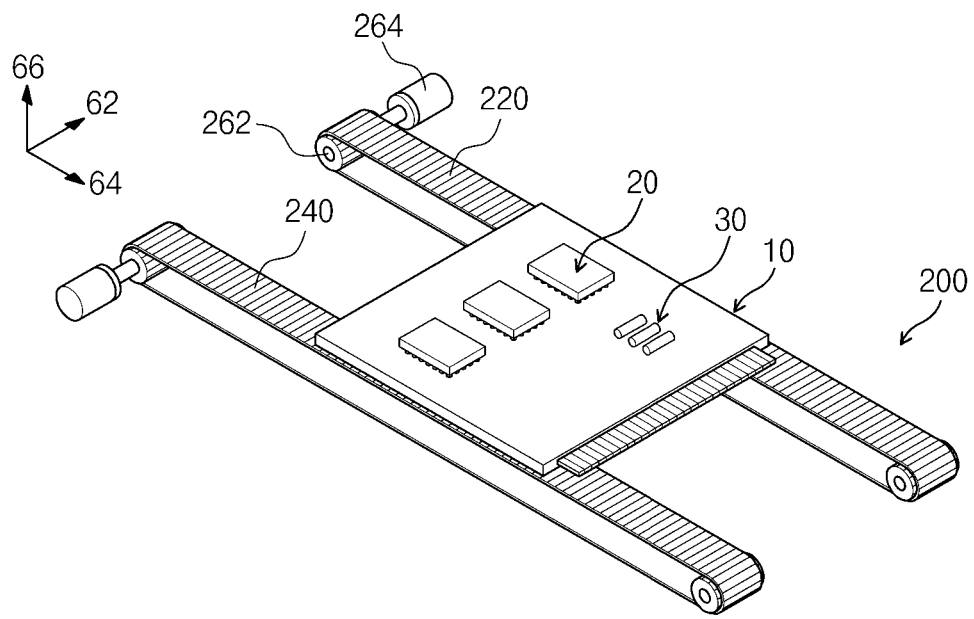
FIG. 4 is a perspective view illustrating a substrate supporting member of FIG. 3.

The substrate supporting member 200 supports the printed circuit board 10 in the housing 100. FIG. 4 is a perspective view illustrating the substrate supporting member 200 according to an embodiment of the present general inventive concept. The substrate supporting member 200 includes a couple of conveyors 220 and 240 to support the printed circuit board 10 and to convey the printed circuit board 10 in the second direction 64. The conveyors 220 and 240 are disposed in the housing 100. A longitudinal direction of the conveyors 220 and 240 is the second direction 64. One end of the conveyor 220 is adjacent to the entrance 121, and the other end of the conveyor 220 is adjacent to the exit 122. Each of the conveyors 220 and 240 is formed in a closed loop. Rollers 262 are disposed in both sides of the conveyor 220, respectively. A motor 264 is connected to one of the rollers 262, and a rotation of the motor 264 rotates the conveyor 220. The conveyors 220 and 240 are spaced apart from each other in the first direction 62. The printed circuit board 10 is placed on the conveyors 220 and 240, and moved in a straight line in the second direction 64 by the rotation of the conveyors 220 and 240. Although edges of the printed circuit board 10 are in contact with the conveyors 220 and 240 as illustrated in FIG. 4, a single conveyor having a width corresponding to a printed circuit board may be provided. Alternatively, a substrate supporting member including a rail that replaces a conveyor may be provided.

The heating member 300 heats the solder balls 22 of the semiconductor chip 20 mounted on the printed circuit board 10 to perform a reflow process. Referring again to FIG. 2, the heating member 300 includes a coil 1301, a power source 302, and a cooling line 1362 of FIG. 6. The coil 1301 is disposed above the conveyors 220 and 240 in the housing 100. Alternatively, the coil 1301 may be disposed under the conveyors 220 and 240, or provided in plurality under and above the conveyors 220 and 240.

Figure 5:
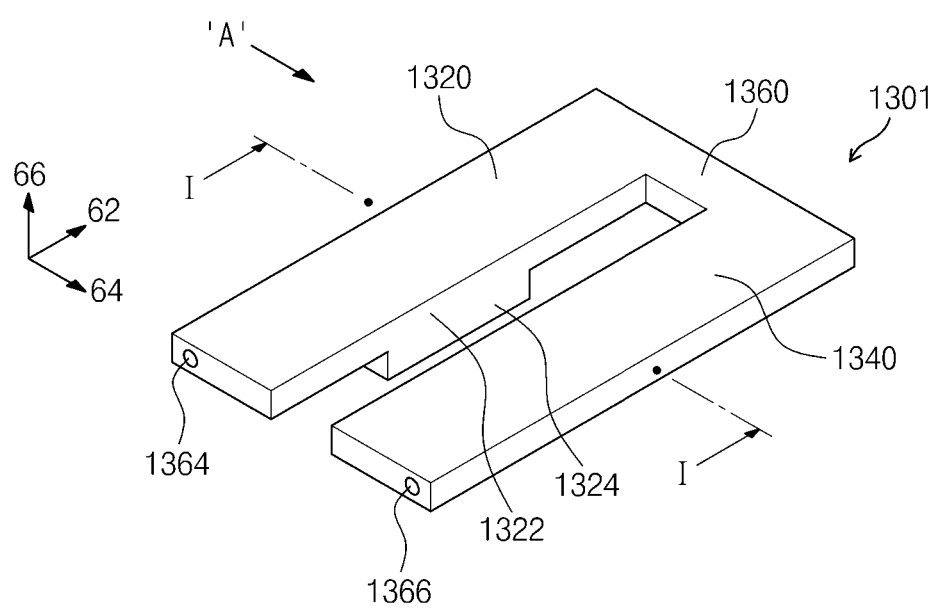
FIG. 5 is a perspective view illustrating a coil of FIG. 3 according to an embodiment of the present general inventive concept.
Figure 6:
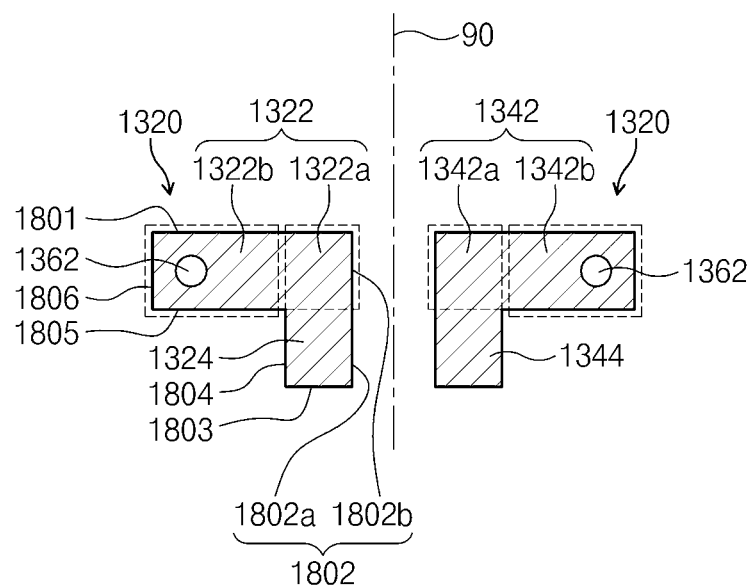
FIG. 6 is a cross-sectional view taken along line I-I of FIG. 5.

FIG. 5 is a perspective view illustrating the coil 1301 of FIG. 2, and FIG. 6 is a cross-sectional view taken along line I-I of FIG. 5. Referring to FIGS. 5 and 6, the coil 1301 includes a first body 1320, a second body 1340, and a third body 1360. Each of the first body 1320 and the second body 1340 has a long rod shape. A longitudinal direction of the first body 1320 and the second body 1340 is the first direction 62. The first body 1320 and the second body 1340 are spaced apart from each other in the second direction 64. Alternatively, the longitudinal direction of the first body 1320 and the second body 1340 may be the second direction 64. The first body 1320 and the second body 1340 substantially have the same shape and are symmetrical with respect to a vertical plane 90 disposed between the first body 1320 and the second body 1340. The third body 1360 electrically connects the first body 1320 to the second body 1340. The third body 1360 extends from one end of the first body 1320 to one end of the second body 1340. A longitudinal direction of the third body 1360 is the second direction 64. Accordingly, the coil 1301 has a U-shape in a plan view.

Since the first body 1320 and the second body 1340 have the same shape, the shape of the first body 1320 will now be mainly described. The first body 1320 includes a top portion 1322 and a bottom portion 1324. A longitudinal direction of the top portion 1322 is substantially the same as the first direction 62. A cross section of the top portion 1322 perpendicular to the first direction 62 has an approximate rectangular shape. The top portion 1322 has the same cross section area in the first direction 62. The top portion 1322 has an inner region 1322*a* and an outer region 1322*b*. The inner region 1322*a* is adjacent to the second body 1340, and the outer region 1322*b* is distant from the second body 1340. In the same manner, an inner region 1342*a* of a top portion 1342 of the second body 1340 is adjacent to the first body 1320, and an outer region 1342*b* of the top portion 1342 of the second body 1340 is distant from the first body 1320.

The bottom portion 1324 protrudes downward from the top portion 1322 along the third direction 66. A cross section of the bottom portion 1324 perpendicular to the third direction 66 is smaller than that of the top portion 1322. The bottom portion 1324 protrudes downward from the inner region 1322a of the top portion 1322. The bottom portion 1324 of the first body 1320 faces a bottom portion 1344 of the second body 1340. A cross section of the bottom portion 1324 perpendicular to the third direction 66 has an approximate rectangular shape. The bottom portion 1324 has the same cross section area in the third direction 66.

The first body 1320 has a top surface 1801, an inner surface 1802, a first bottom surface 1803, a first outer surface 1804, a second bottom surface 1805, and a second outer surface 1806 that are sequentially and continuously arrayed clockwise. The inner surface 1802 faces the second body 1340. The top portion 1322 is defined by the top surface 1801, a portion 1802b of the inner surface 1802, the second bottom surface 1805, and the second outer surface 1806. The bottom portion 1324 is defined by a portion 1802a of the inner surface 1802, the first bottom surface 1803, and the first outer surface 1804. The top surface 1801, the first bottom surface 1803, the second bottom surface 1805 are substantially parallel to each other. The inner surface 1802, the first outer surface 1804, and the second outer surface 1806 are substantially parallel to each other. The top surface 1801 is substantially perpendicular to the inner surface 1802. The portion 1802b of the inner surface 1802 defining the top portion 1322, and the portion 1802a of the inner surface 1802 defining the bottom portion 1324 are disposed in the same plane. Accordingly, a cross section of the first body 1320, perpendicular to the longitudinal direction of the first body 1320, has an approximate L-shape.

A cooling member protects the coil 1301 against heat. The cooling member includes a cooling line 1362. The cooling line 1362 is disposed in the coil 1301. The cooling line 1362 extends from the first body 1320 to the second body 1340. The cooling line 1362 may be disposed in the outer region 1322b of the first body 1320 and the outer region 1342b of the second body 1340. One end of the first body 1320 is provided with a supply port 1364, and one end of the second body 1340 is provided with a return port 1366. The supply port 1364 is connected to a supply pipe 1367 of FIG. 2, and the return port 1366 is connected to a return pipe 1368 of FIG. 2. A cooling fluid, supplied to the coil 1301 through the supply pipe 1367, sequentially flows in the first body 1320, the third body 1360, and the second body 1340 along the cooling line 1362 and is discharged out of the coil 1301 through the return pipe 1368. The heating member 300 may include a housing surrounding the coil 1301, and the cooling member may be disposed around the coil 1301 in the housing.

The power source 302 is electrically connected to the coil 1301 and applies a current to the coil 1301. The power source 302 applies a current to the first body 1320 or the second body 1340. In the present embodiment, the first body 1320 is grounded, and an alternating current is applied to the second body 1340.

The heating member 300 heats the solder ball 22 through an induction heating method. When an alternating current is applied to the coil 1301, an alternating magnetic field is generated around the coil 1301. When a conductor is provided to a region where a magnetic field is generated, an eddy current occurs in a perpendicular direction to a direction of the magnetic field. The eddy current flows along the surface of a conductor and generates heat, causing eddy current loss. The induction heating method is a method of heating an object by using heat generated through the eddy current loss.

Figure 7:
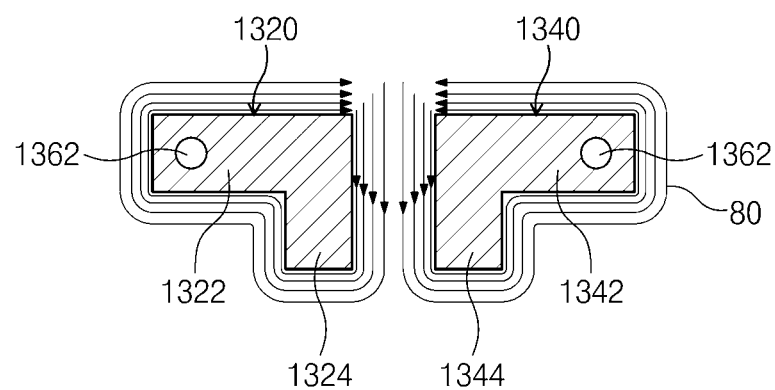
FIG. 7 is a schematic view illustrating magnetic lines of force generated around the coil of FIG. 5.

FIG. 7 is a schematic view illustrating magnetic lines 80 of force generated around the coil 1301 of FIG. 5 when a current is applied to the coil 1301. Since an alternating current is applied to the coil 1301, directions of the magnetic lines 80 of force are continually changed. Referring to FIG. 7, the magnetic lines 80 of force substantially conform with the cross section of the coil 1301, and the intensity of the magnetic lines 80 of force is reduced in a distant direction from the coil 1301. When the printed circuit board 10 on which the semiconductor chip 20 is mounted is disposed under the coil 1301 of FIG. 5, a heating temperature of a region of the printed circuit board 10 facing the first bottom surface 1803 is greater than that of a region of the printed circuit board 10 facing the second bottom surface 1805. A plurality of conductive lines (not shown) are disposed in the printed circuit board 10. When a reflow process is performed on the solder balls 22, the conductive lines of the printed circuit board 10 as well as the solder balls 22 are heated, which is undesirable. The coil 1301 of FIG. 5 is adapted to reduce thermal deformation of the conductive lines of the printed circuit board 10 and to selectively heat only the semiconductor chip 20 at a high temperature.

Figure 8:
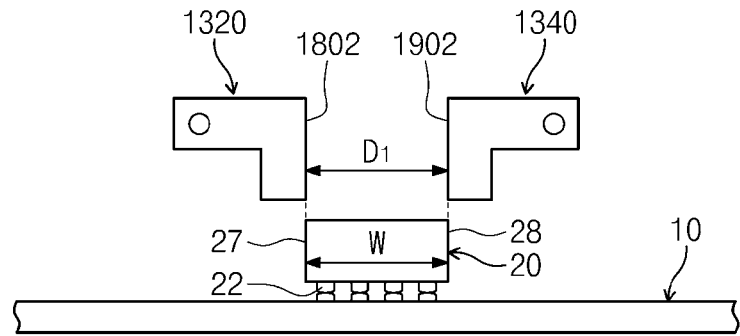
FIG. 8 is a schematic view illustrating a relative position between a semiconductor chip and the coil of FIG. 5 according to an embodiment of the present general inventive concept.

FIG. 8 is a schematic view illustrating a relative position between the printed circuit board 10 and the coil 1301 when a reflow process is performed using the coil 1301 of FIG. 5, according to an embodiment of the inventive concept. Referring to FIG. 8, a distance D1 between the inner surface 1802 of the first body 1320 and an inner surface 1902 of the second body 1340 substantially corresponds to a width W of the semiconductor chip 20. When the reflow process is performed, the semiconductor chip 20 faces the space between the inner surface 1802 of the first body 1320 and the inner surface 1902 of the second body 1340. For example, a first side surface 27 of the semiconductor chip 20 and the inner surface 1802 of the first body 1320 may be disposed in approximately the same plane, and a second side surface 28 of the semiconductor chip 20 and the inner surface 1902 of the second body 1340 may be disposed in approximately the same plane. Alternatively, the distance D1 between the inner surface 1802 of the first body 1320 and the inner surface 1902 of the second body 1340 may be greater than the width W of the semiconductor chip 20, and thus, the inner surface 1802 of the first body 1320 and the inner surface 1902 of the second body 1340 may be disposed outside of the semiconductor chip 20. When the semiconductor chip 20 is disposed as illustrated in FIG. 8, overheating of the semiconductor chip 20 can be prevented.

Figure 9:
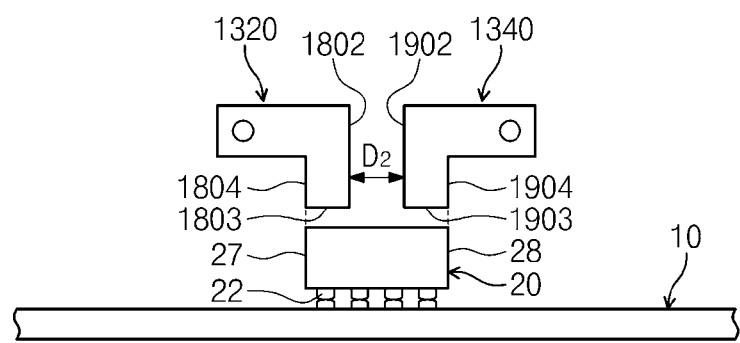
FIG. 9 is a schematic view illustrating a relative position between a semiconductor chip and the coil of FIG. 5 according to another embodiment of the present general inventive concept.

FIG. 9 is a schematic view illustrating a relative position between the printed circuit board 10 and the coil 1301 when a reflow process is performed, according to another embodiment of the present general inventive concept. Referring to FIG. 9, a distance between the first outer surface 1804 of the first body 1320 and a first outer surface 1904 of the second body 1340 is approximately the same as a width W of the semiconductor chip 20. Thus, a distance D2 between the inner surface 1802 of the first body 1320 and the inner surface 1902 of the second body 1340 is less than a width W of the semiconductor chip 20. When the reflow process is performed, the semiconductor chip 20 faces the first bottom surface 1803 of the first body 1320 and a first bottom surface 1903 of the second body 1340. For example, the first side surface 27 of the semiconductor chip 20 and the first outer surface 1804 of the first body 1320 may be disposed in the same plane, and the second side surface 28 of the semiconductor chip 20 and the first outer surface 1904 of the second body 1340 may be disposed in the same plane. Alternatively, the distance between the first outer surface 1804 of the first body 1320 and the first outer surface 1904 of the second body 1340 may be less than the width W of the semiconductor chip 20, and the first outer surface 1804 of the first body 1320 and the first outer surface 1904 of the second body 1340 may be disposed inside of the semiconductor chip 20. When the semiconductor chip 20 is disposed as illustrated in FIG. 9, the semiconductor chip 20 can be quickly heated at a high temperature.

Figure 10:
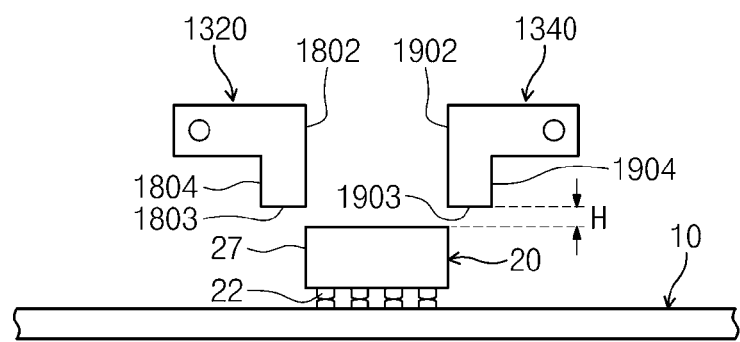
FIG. 10 is a schematic view illustrating a distance between a semiconductor chip and the coil of FIG. 5 according to an embodiment of the present general inventive concept.

FIG. 10 is a schematic view illustrating a height difference between the semiconductor chip 20 and the coil 1301 of FIG. 5 when a reflow process is performed using the coil 1301, according to an embodiment of the present general inventive concept. Referring to FIG. 10, when the reflow process is performed, the coil 1301 is disposed above the semiconductor chip 20, and a distance H between the semiconductor chip 20 and both the first bottom surface 1803 of the first body 1320 and the first bottom surface 1903 of the second body 1340 may be approximately 1 mm or less. Alternatively, the top surface the semiconductor chip 20 may have the same height as both the first bottom surface 1803 of the first body 1320 and the first bottom surface 1903 of the second body 1340.

Figure 11:
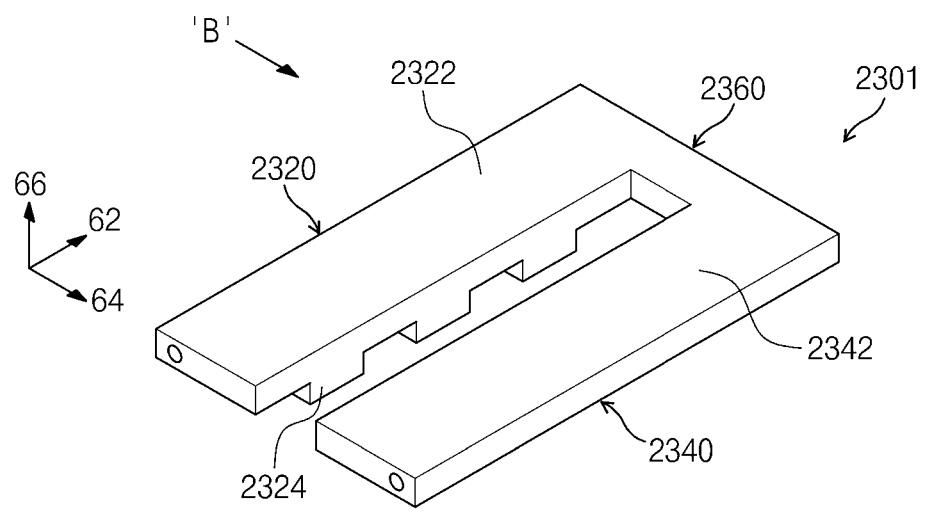
FIG. 11 is a perspective view illustrating a coil according to another embodiment of the present general inventive concept.
Figure 12:
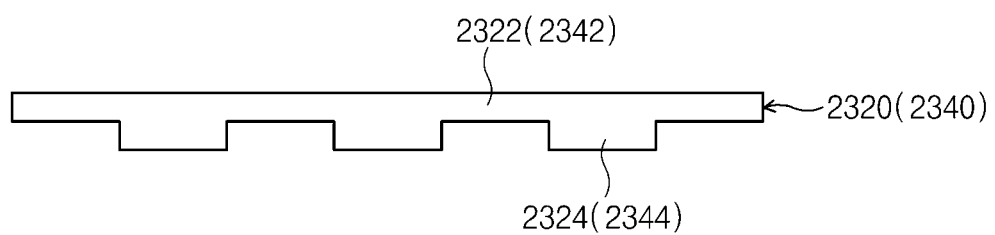
FIG. 12 is a side view taken in a direction 'B' of FIG. 11.
Figure 13:
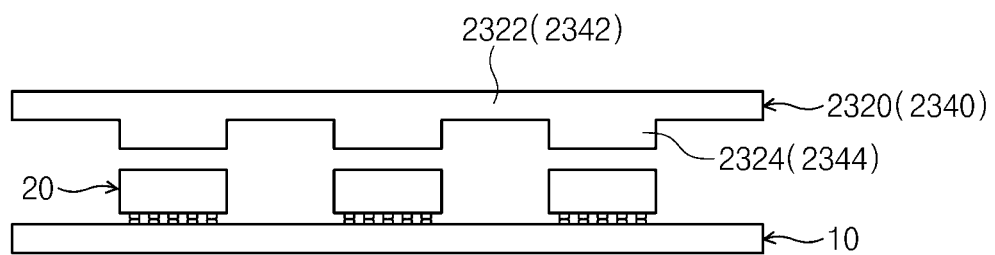
FIG. 13 is a schematic view illustrating relative positions between semiconductor chips and the coil of FIG. 12 according to an embodiment of the present general inventive concept.

FIG. 11 is a perspective view illustrating a coil 2301 according to another embodiment of the present general inventive concept. FIG. 12 is a side view taken in a direction 'B' of FIG. 11. FIG. 13 is a schematic view illustrating relative positions between the semiconductor chips 20 and the coil 2301 of FIG. 11 according to an embodiment of the present general inventive concept. Referring to FIGS. 11 through 13, the coil 2301 includes a first body 2320, a second body 2340, and a third body 2360. The first body 2320 includes a top portion 2322 and a plurality of bottom portions 2324. The second body 2340 includes a top portion 2342 and a plurality of bottom portions 2344. The first body 2320, the second body 2340, and the third body 2360 are similar in structure to the first body 1320, the second body 1340, and the third body 1360 of the coil 1301 of FIG. 5, respectively. The top portions 2322 and 2342 are similar in structure to the top portions 1322 and 1342 of the coil 1301 of FIG. 5. The bottom portions 2324 of the first body 2320 are arranged in a straight line along a longitudinal direction of the first body 2320, and spaced at a predetermined distance from each other along the first direction 62. The bottom portions 2324 of the first body 2320 have the same shape and size. The bottom portions 2324 of the first body 2320 have the same protruding length from the upper ends of the bottom portions 2324. The distances between the neighboring bottom portions 2324 may be the same or different. When the semiconductor chip 20 mounted on the printed circuit board 10 is provided in plurality, the distance between the neighboring bottom portions 2324 may depend on the distance between the semiconductor chips 20. The second body 2340 and the first body 2320 have the same shape. The bottom portions 2344 of the second body 2340 face the bottom portions 2324 of the first body 2320, respectively. When a reflow process is performed, the bottom portions 2324 of the first body 2320 and the bottom portions 2344 of the second body 2340 correspond to the semiconductor chips 20 mounted on the printed circuit board 10, respectively. Thus, the reflow process is performed simultaneously on the semiconductor chips 20.

Figure 14:
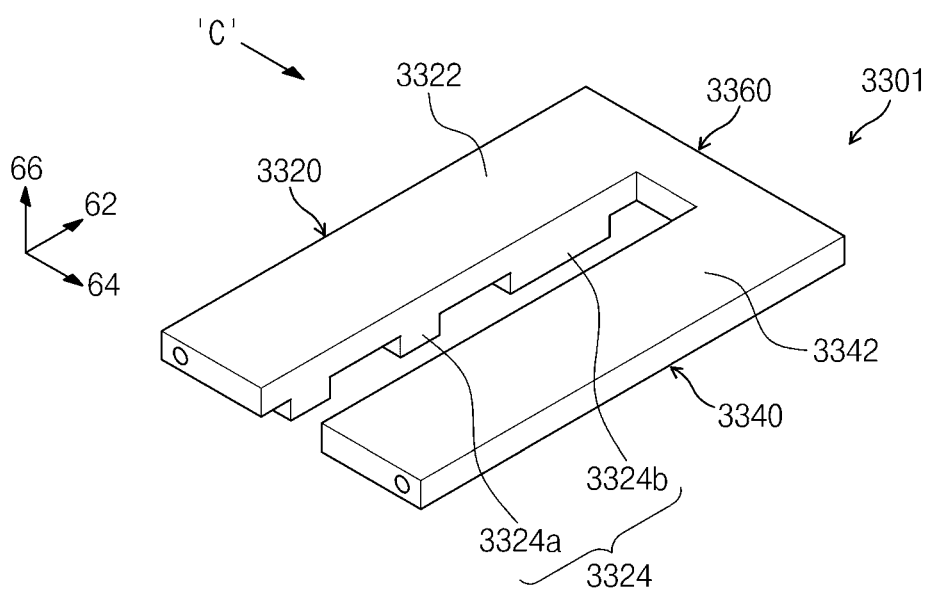
FIG. 14 is a perspective view illustrating a coil according to another embodiment of the present general inventive concept.
Figure 15:
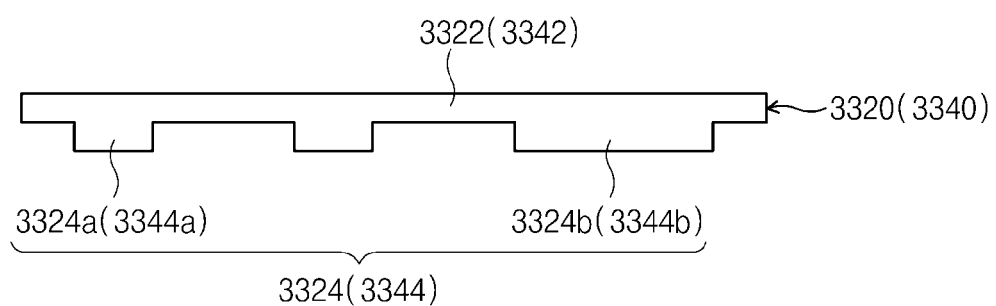
FIG. 15 is a side view taken in a direction 'C' of FIG. 14.
Figure 16:
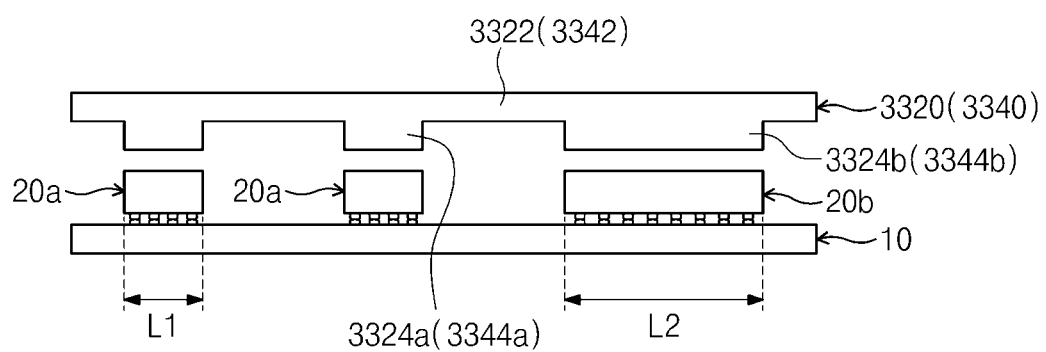
FIG. 16 is a schematic view illustrating relative positions between semiconductor chips and the coil of FIG. 14 according to an embodiment of the present general inventive concept.

FIG. 14 is a perspective view illustrating a coil 3301 according to another embodiment of the present general inventive concept. FIG. 15 is a side view taken in a direction 'C' of FIG. 14. FIG. 16 is a schematic view illustrating relative positions between the semiconductor chips 20 and the coil 3301 of FIG. 14 according to an embodiment of the present general inventive concept. Referring to FIGS. 14 through 16, the coil 3301 includes a first body 3320, a second body 3340, and a third body 3360. The first body 3320 includes a top portion 3322 and a plurality of bottom portions 3324. The second body 3340 includes a top portion 3342 and a plurality of bottom portions 3344. The first body 3320, the second body 3340, and the third body 3360 are similar in structure to the first body 2320, the second body 2340, and the third body 2360 of the coil 2301 of FIG. 11, respectively. The top portions 3322 and 3342 are similar in structure to the top portions 2322 and 2342 of the coil 2301 of FIG. 11.

The first body 3320 includes one or more first bottom portions 3324a and at least one second bottom portion 3324b, and the second body 3340 includes one or more first bottom portions 3344a and at least one second bottom portion 3344b. In FIG. 14, the first body 3320 includes the two first bottom portions 3324a and the single second bottom portion 3324b, and the second body 3340 includes the two first bottom portions 3344a and the single second bottom portion 3344b. The first bottom portions 3324a of the first body 3320 face the first bottom portions 3344a of the second body 3340, and the second bottom portion 3324b of the first body 3320 faces the second bottom portion 3344b of the second body 3340. The first bottom portion 3324a and the second bottom portion 3324b have different lengths from each other along the first direction 62. The lengths of the first bottom portions 3324a and the second bottom portion 3324b correspond to the sizes of semiconductor chips disposed under the first bottom portions 3324a and the second bottom portion 3324b when a reflow process is performed. The length of the second bottom portion 3324b is greater than those of the first bottom portions 3324a along the first direction 62 as illustrated in FIG. 14. When the coil 3301 of FIG. 14 is used in a reflow process for the solder balls 22, the reflow process can be performed simultaneously on the semiconductor chips 20 having different sizes from each other.

As illustrated in FIG. 16, one or more first semiconductor chips 20a and at least one second semiconductor chip 20b are mounted on the printed circuit board 10. The first semiconductor chip 20a has a length L1 to correspond to the first bottom portion 3324a, and the second semiconductor chip 20b has a length L2 to correspond to the second bottom portion 3324b. During a reflow process, the first bottom portions 3324a correspond to the first semiconductor chips 20a, and the second bottom portion 3324b corresponds to the second semiconductor chip 20b. Although a number of the first bottom portions 3324a having different lengths is two in the present embodiment, the number of the first bottom portions 3324a having different lengths may be three or more.

Figure 17:
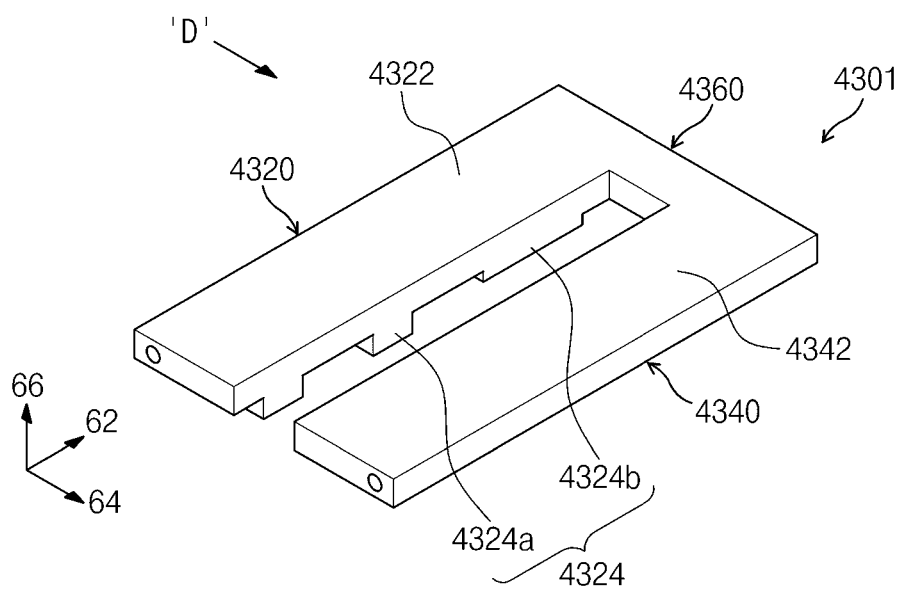
FIG. 17 is a perspective view illustrating a coil according to another embodiment of the present general inventive concept.
Figure 18:
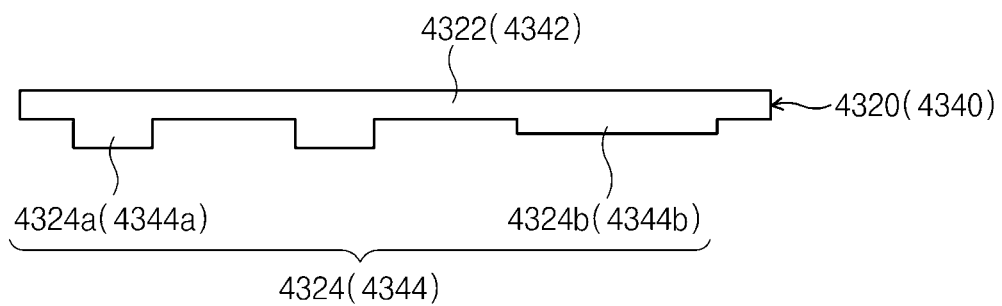
FIG. 18 is a side view taken in a direction 'D' of FIG. 17.
Figure 19:
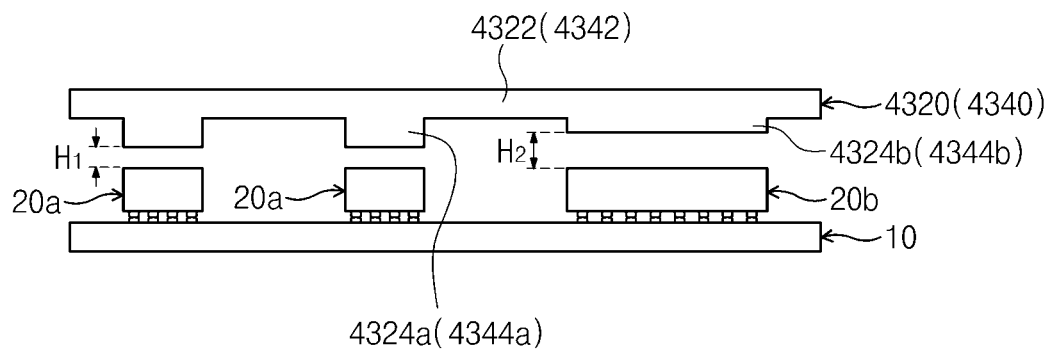
FIG. 19 is a schematic view illustrating relative positions between semiconductor chips and the coil of FIG. 18 according to another embodiment of the present general inventive concept.

FIG. 17 is a perspective view illustrating a coil 4301 according to another embodiment of the present general inventive concept. FIG. 18 is a side view taken in a direction 'D' of FIG. 17. FIG. 19 is a schematic view illustrating relative positions between the semiconductor chips 20 and the coil 4301 of FIG. 17 according to another embodiment of the present general inventive concept. Referring to FIGS. 17 through 19, the coil 4301 includes a first body 4320, a second body 4340, and a third body 4360. The first body 4320 includes a top portion 4322 and a plurality of bottom portions 4324. The second body 4340 includes a top portion 4342 and a plurality of bottom portions 4344. The first body 4320, the second body 4340, and the third body 4360 are similar in structure to the first body 2320, the second body 2340, and the third body 2360 of the coil 2301 of FIG. 11, respectively. The top portions 4322 and 4342 are similar in structure to the top portions 2322 and 2342 of the coil 2301 of FIG. 11.

The first body 4320 includes one or more first bottom portions 4324a and at least one second bottom portion 4324b, and the second body 4340 includes one or more first bottom portions 4344a and at least one second bottom portion 4344b.

In FIG. 17, the first body 4320 includes the two first bottom portions 4324a and the at least one second bottom portion 4324b, and the second body 4340 includes the two first bottom portions 4344a and the at least one second bottom portion 4344b. The first bottom portions 4324a of the first body 4320 face the first bottom portions 4344a of the second body 4340, and the second bottom portion 4324b of the first body 4320 faces the second bottom portion 4344b of the second body 4340. The first bottom portion 4324a and the second bottom portion 4324b have different lengths from each other along the third direction 66. In FIG. 17, the length of the second bottom portion 4324b is less than those of the first bottom portions 4324a along the third direction 66. Thus, in a reflow process, the distances between the semiconductor chips 20 and the first and second bottom portions 4324a and 4324b corresponding to the semiconductor chips 20 can be varied according to the types of the semiconductor chips 20.

Conductive lines (not shown) disposed in the semiconductor chip 20 are heated during a reflow process, and the heated conductive lines affect heating of the solder balls 22. As the areas of the conductive lines provided to the semiconductor chip 20 are increased, a heating temperature of the solder balls 22 is increased. Thus, a distance between the lower portion of a coil and the semiconductor chip 20 having a great number of conductive lines is greater than a distance between the lower portion of a coil and the semiconductor chip 20 having a small number of conductive lines. As the size of the semiconductor chip 20 is increased, the number of conductive lines disposed in the semiconductor chip 20 is increased.

According to the present embodiment, one or more first semiconductor chips 20a and at least one second semiconductor chip 20b are mounted on the printed circuit board 10. An area of the second semiconductor chip 20b is greater than an area of the first semiconductor chip 20a in a plan view. During a reflow process, the first bottom portion 4324a having a long protruding length along the third direction 66 corresponds to the first semiconductor chip 20a, and the second bottom portion 4324b having a short protruding length along the third direction 66 corresponds to the second semiconductor chip 20b. Accordingly, a distance H1 between the first semiconductor chip 20a and the first bottom portion 4324a is less than a distance H2 between the second semiconductor chip 20b and the second bottom portion 4324b. The coil 4301 of FIG. 17 is adapted to improve uniformity in the temperatures of the solder balls 22 of the semiconductor chips 20. Although the coil 4301 includes two types of bottom portions having different protruding lengths in the present embodiment, the coil 4301 may include three or more types of bottom portions having different protruding lengths. In addition, although the lengths of the first bottom portion 4324a and the second bottom portion 4324b are different from each other along the first direction 62 in the present embodiment, the lengths of the first bottom portions 4324a and the second bottom portion 4324b may be the same along the first direction 62.

Figure 20:
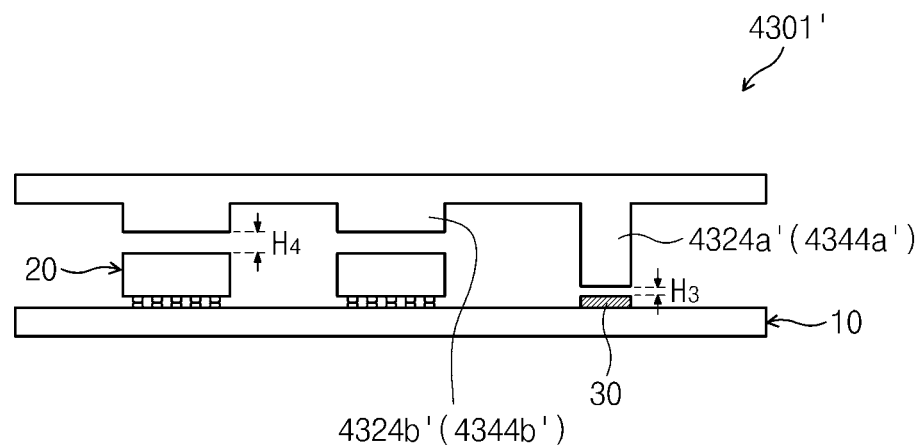
FIG. 20 is a schematic view illustrating relative positions between semiconductor chips and a coil according to another embodiment of the present general inventive concept.

The printed circuit board 10 is provided with a passive device 30, such as a transistor, together with the semiconductor chip 20. A terminal (not shown) provided to the passive device 30 and terminals (not shown) provided to the printed circuit board 10 should be heated for electrical contact between the passive device 30 and the printed circuit board 10. The passive device 30, such as a transistor, is smaller than the semiconductor chip 20. When the passive device 30 is installed on the printed circuit board 10, the height of the passive device 30 is less than the height of the semiconductor chip 20. FIG. 20 is a schematic view illustrating a state where the semiconductor chips 20 and the passive device 30 are simultaneously reflown according to an embodiment of the present general inventive concept. First bottom portion 4324a' and 4344a' of a coil 4301', which has a large protruding length, corresponds to the passive device 30. Second bottom portions 4324b' and 4344b', having a small protruding length, correspond to the semiconductor chips 20. Accordingly, a distance H3 between the passive device 30 and the first bottom portion 4324a' is less than a distance H4 between the semiconductor chip 20 and the second bottom portion 4324b'.

Figure 21:
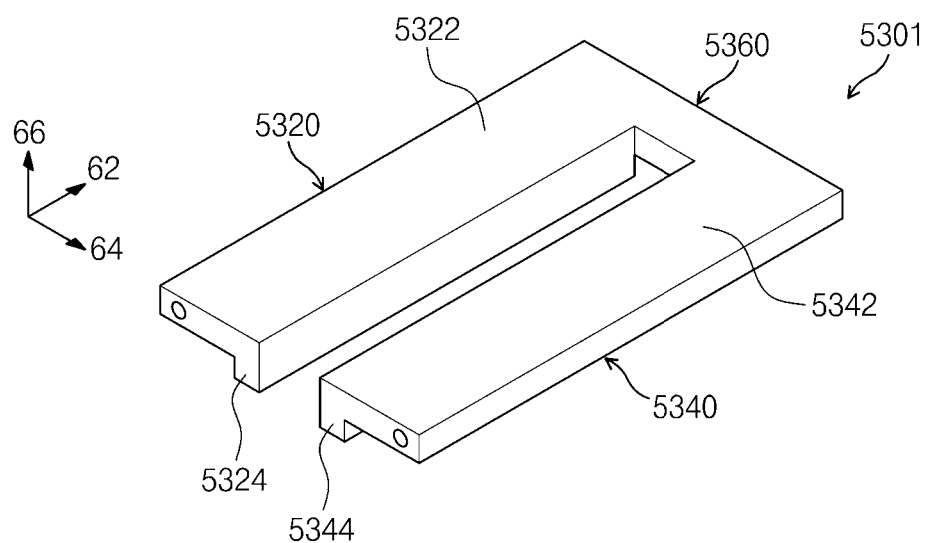
FIG. 21 is a perspective view illustrating a coil according to another embodiment of the present general inventive concept.
Figure 22:
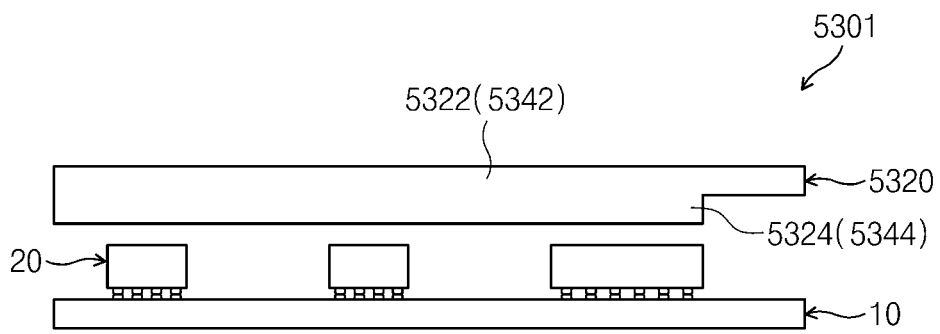
FIG. 22 is a schematic view illustrating relative positions between the coil of FIG. 21 and semiconductor chips according to another embodiment of the present general inventive concept.

FIG. 21 is a perspective view illustrating a coil 5301 according to another embodiment of the present general inventive concept. FIG. 22 is a schematic view illustrating relative positions between the coil 5301 of FIG. 21 and the semiconductor chips 20 according to another embodiment of the present general inventive concept. Referring to FIG. 21, the coil 5301 includes a first body 5320, a second body 5340, and a third body 5360. The first body 5320 includes a top portion 5322 and a bottom portion 5324. The second body 5340 includes a top portion 5342 and a bottom portion 5344. The first body 5320, the second body 5340, and the third body 5360 are similar in structure to the first body 1320, the second body 1340, and the third body 1360 of the coil 1301 of FIG. 5, respectively. The top portions 5322 and 5342 are similar in structure to the top portions 1322 and 1342 of the coil 1301 of FIG. 5. Unlike the coil 1301 of FIG. 5, the bottom portion 5324 of the first body 5320 is elongated such that the semiconductor chips 20 are arrayed in a region that the bottom portion 5324 faces. The bottom portion 5324 of the first body 5320 extends from an end of the first body 5320 or from an adjacent region to the end of the first body 5320 to the other end of the first body 5320 or to an adjacent region to the other end of the first body 5320. The second body 5340 and the first body 5320 have the same shape. The bottom portion 5344 of the second body 5340 faces the bottom portion 5324 of the first body 5320.

Figure 23:
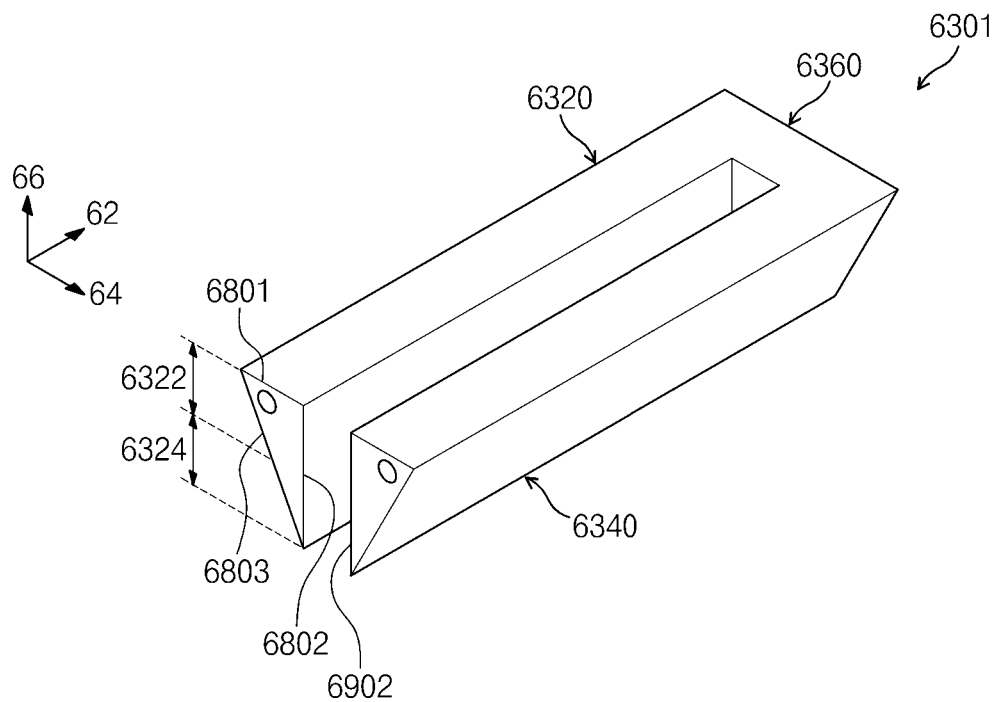
FIG. 23 is a perspective view illustrating a coil according to another embodiment of the present general inventive concept.
Figure 24:
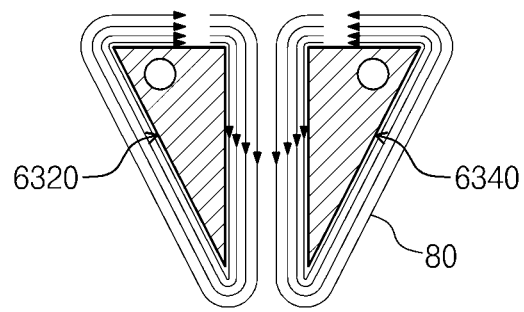
FIG. 24 is a schematic view illustrating magnetic lines of force generated around the coil of FIG. 23.
Figure 25:
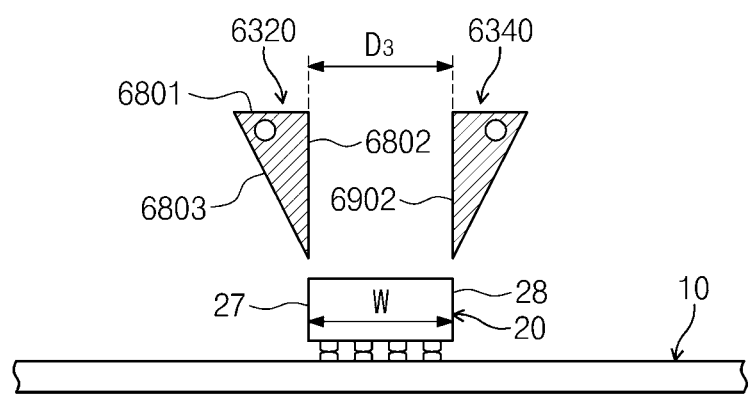
FIG. 25 is a schematic view illustrating a relative position between the coil of FIG. 23 and a semiconductor chip according to another embodiment of the present general inventive concept.

FIG. 23 is a perspective view illustrating a coil 6301 according to another embodiment of the present general inventive concept. FIG. 24 is a schematic view illustrating magnetic lines 80 of force generated around the coil 6301 of FIG. 23. FIG. 25 is a schematic view illustrating a relative position between the coil 6301 of FIG. 23 and the semiconductor chip 20 according to another embodiment of the present general inventive concept. Referring to FIG. 24, since an alternating current is applied to the coil 6301, directions of the magnetic lines 80 of force are continually changed. Referring to FIGS. 23 through 25, the coil 6301 includes a first body 6320, a second body 6340, and a third body 6360. Longitudinal directions of the first body 6320 and the second body 6340 are parallel to the first direction 62. The first body 6320 is spaced a predetermined distance from the second body 6340 along the second direction 64. The first body 6320 and the second body 6340 have the same shape and are parallel to each other. The third body 6360 extends from one end of the first body 6320 to one end of the second body 6340, and electrically connects the first body 6320 to the second body 6340.

Cross sections of the first body 6320, perpendicular to the longitudinal direction of the first body 6320, have the same shape and the same area along the longitudinal direction of the first body 6320. The first body 6320 decreases in width from its upper end to its lower end. According to the present embodiment, the cross section of the first body 6320, perpendicular to the longitudinal direction of the first body 6320, may have a right angled triangle shape. The first body 6320 has a top surface 6801, an inner surface 6802, and a bottom surface 6803. The inner surface 6802 faces the second body

6340. The top surface 6801 is perpendicular to the inner surface 6802. The bottom surface 6803 is inclined upward in a distant direction from the second body 6340. The first body 6320 includes a top portion 6322 and a bottom portion 6324.

A distance D3 between the inner surface 6802 of the first body 6320 and an inner surface 6902 of the second body 6340 is approximately the same as the width W of the semiconductor chip 20. During a reflow process, the first side surface 27 of the semiconductor chip 20 corresponds to the inner surface 6802 of the first body 6320, and the second side surface 28 of the semiconductor chip 20 corresponds to the inner surface 6902 of the second body 6340. Alternatively, the distance between the inner surface 6802 of the first body 6320 and the inner surface 6902 of the second body 6340 is greater than the width W of the semiconductor chip 20, and the semiconductor chip 20 may be disposed between the inner surface 6802 of the first body 6320 and the inner surface 6902 of the second body 6340 during a reflow process.

Figure 26:
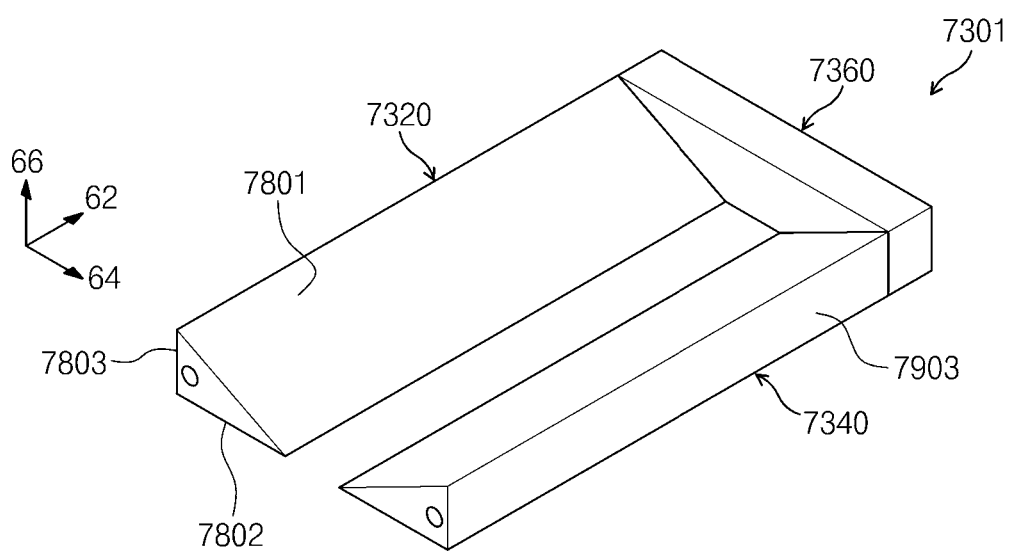
FIG. 26 is a perspective view illustrating a coil according to another embodiment of the present general inventive concept.
Figure 27:
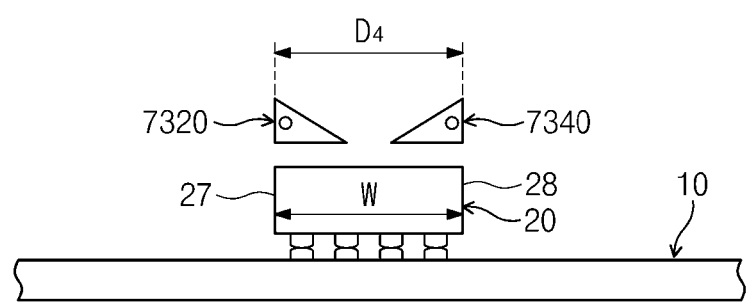
FIG. 27 is a schematic view illustrating a relative position between the coil of FIG. 26 and a semiconductor chip according to another embodiment of the present general inventive concept.

FIG. 26 is a perspective view illustrating a coil 7301 according to another embodiment of the inventive concept. FIG. 27 is a schematic view illustrating a relative position between the coil 7301 of FIG. 26 and the semiconductor chip 20 according to another embodiment of the present general inventive concept. Referring to FIGS. 26 and 27, the coil 7301 includes a first body 7320, a second body 7340, and a third body 7360. Longitudinal directions of the first body 7320 and the second body 7340 are parallel to the first direction 62. The first body 7320 is spaced a predetermined distance from the second body 7340 along the second direction 64. The first body 7320 and the second body 7340 have the same shape and are parallel to each other. The third body 7360 extends from an end of the first body 7320 to an end of the second body 7340, and electrically connects the first body 7320 to the second body 7340.

Cross sections of the first body 7320, perpendicular to the longitudinal direction of the first body 7320, have the same shape and the same area along the longitudinal direction of the first body 7320. The first body 7320 increases in width from its upper end to its lower end. According to the present embodiment, the cross section of the first body 7320, perpendicular to the longitudinal direction of the first body 7320, may have a right angled triangle shape. The first body 7320 has an inner surface 7801, a bottom surface 7802, and an outer surface 7803. The inner surface 7801 faces the second body 7340. The bottom surface 7802 is perpendicular to the outer surface 7803. The bottom surface 7802 is perpendicular to a vertical plane disposed between the first body 7320 and the second body 7340.

A distance D4 between the outer surface 7803 of the first body 7320 and an outer surface 7903 of the second body 7340 is approximately the same as the width W of the semiconductor chip 20. During a reflow process, the first side surface 27 of the semiconductor chip 20 corresponds to the outer surface 7803 of the first body 7320, and the second side surface 28 of the semiconductor chip 20 corresponds to the outer surface 7903 of the second body 7340. Alternatively, the distance between the outer surface 7803 of the first body 7320 and the outer surface 7903 of the second body 7340 may be greater or less than the width W of the semiconductor chip 20.

Figure 28:
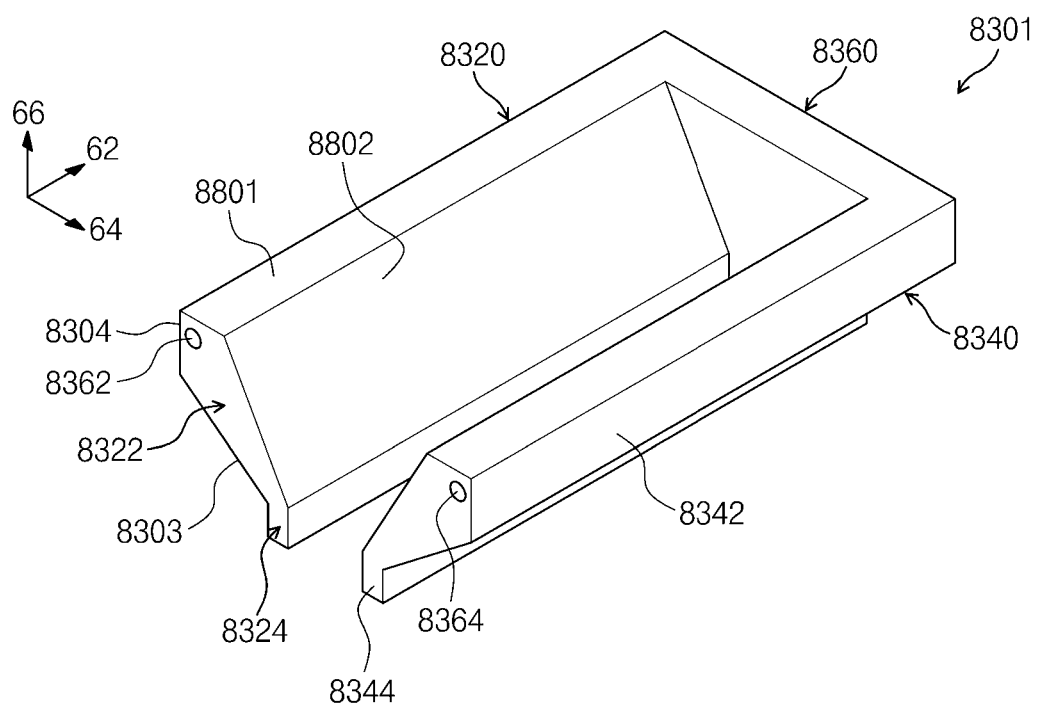
FIG. 28 is a perspective view illustrating a coil according to another embodiment of the present general inventive concept.

FIG. 28 is a perspective view illustrating a coil 8301 according to another embodiment of the present general inventive concept. Referring to FIG. 28, the coil 8301 includes a first body 8320, a second body 8340, and a third body 8360. The first body 8320 includes a top portion 8322 and a bottom portion 8324. The second body 8340 includes a top portion 8342 and a bottom portion 8344. The first body 8320, the second body 8340, and the third body 8360 are similar in structure to the first body 5320, the second body 5340, and the third body 5360 of the coil 5301 of FIG. 21, respectively. The bottom portions 8324 and 8344 are similar in structure to the bottom portions 5324 and 5344 of the coil 5301 of FIG. 21. The top portion 8322 of the first body 8320 has a top surface 8801, an inner surface 8802, a bottom surface 8303, and an outer surface 8304. The bottom surface 8303, the outer surface 8304, the top surface 8801, and the inner surface 8802 are sequentially and continuously arrayed clockwise. The top surface 8801 is perpendicular to the outer surface 8304. The inner surface 8802 is inclined from its lower end to its upper end in a distant direction from the second body 8340. The bottom surface 8303 is inclined from its lower end to its upper end in the distant direction from the second body 8340. From a vertical plane between the first body 8320 and the second body 8340, an inclination angle of the inner surface 8802 is less than that of the bottom surface 8303. The bottom portion 8324 extends downward between the inner surface 8802 and the bottom surface 8303. Cross sections of the bottom portion 8324, perpendicular to the third direction 66, have the same shape. The first body 8320 and the second body 8340 have the same shape. The first body 8320 and the second body 8340 are symmetrical with respect to a vertical plane disposed therebetween. A relationship between the semiconductor chip 20 and the distance between the bottom portion 8324 of the first body 8320 and the bottom portion 8344 of the second body 8340 may be the same as that of FIG. 8 or 9.

Figure 29:
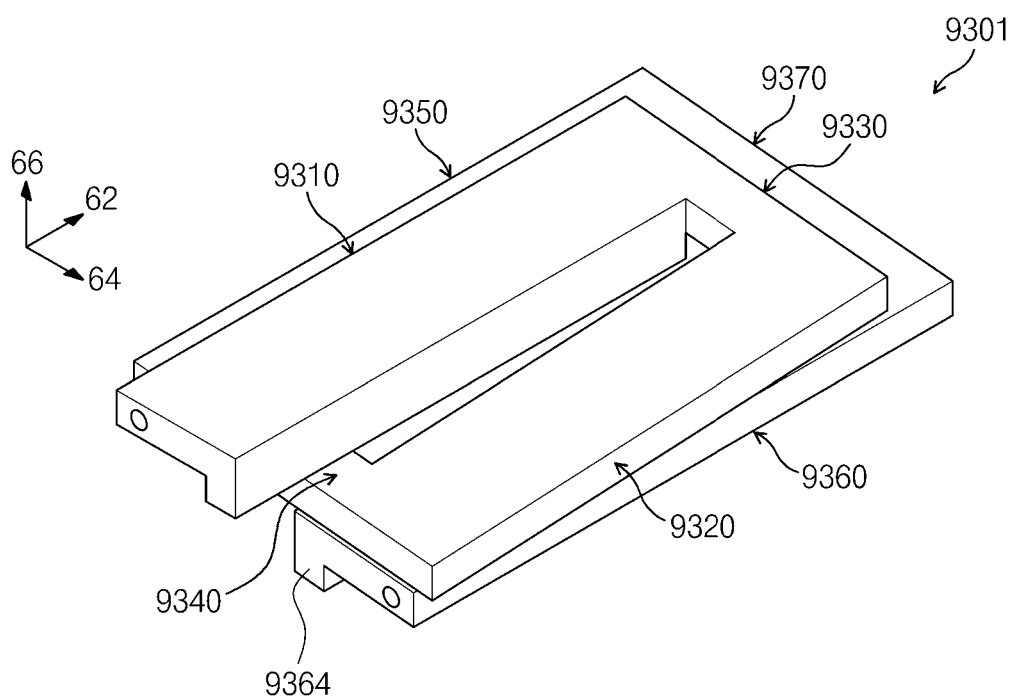
FIG. 29 is a perspective view illustrating a coil according to another embodiment of the present general inventive concept.

FIG. 29 is a perspective view illustrating a coil 9301 according to another embodiment of the present general inventive concept. Referring to FIG. 29, the coil 9301 includes a first body 9310, a second body 9320, a third body 9330, a fourth body 9340, a fifth body 9350, a sixth body 9360, and a seventh body 9370. The first body 9310 is spaced a predetermined distance from the second body 9320 along the second direction 64. The fifth body 9350 is spaced a predetermined distance from the sixth body 9360 along the second direction 64. The fifth body 9350 faces the first body 9310 under the first body 9310. The sixth body 9360 faces the second body 9320 under the second body 9320. Each of the first body 9310, the second body 9320, the fifth body 9350, and the sixth body 9360 has an L-shaped cross section perpendicular to its longitudinal direction, which is similar to the cross section of the coil 5301 of FIG. 21. The first body 9310 is electrically connected to the second body 9320 through the third body 9330. The second body 9320 is electrically connected to the fifth body 9350 through the fourth body 9340. The fifth body 9350 is electrically connected to the sixth body 9360 through the seventh body 9370. The semiconductor chip 20 is disposed under the fifth body 9350 and the sixth body 9360. A relationship between the semiconductor chip 20 and the distance between a bottom portion of the fifth body 9350 and a bottom portion 9364 of the sixth body 9360 may be the same as that of FIG. 8 or 9.

In the present embodiment, the first body 9310, the second body 9320, the fifth body 9350, and the sixth body 9360 have L-shaped cross sections. However, the first body 9310, the second body 9320, the fifth body 9350, and the sixth body 9360 may have right angled triangle cross sections as illustrated in FIG. 23 or 26.

Figure 30:
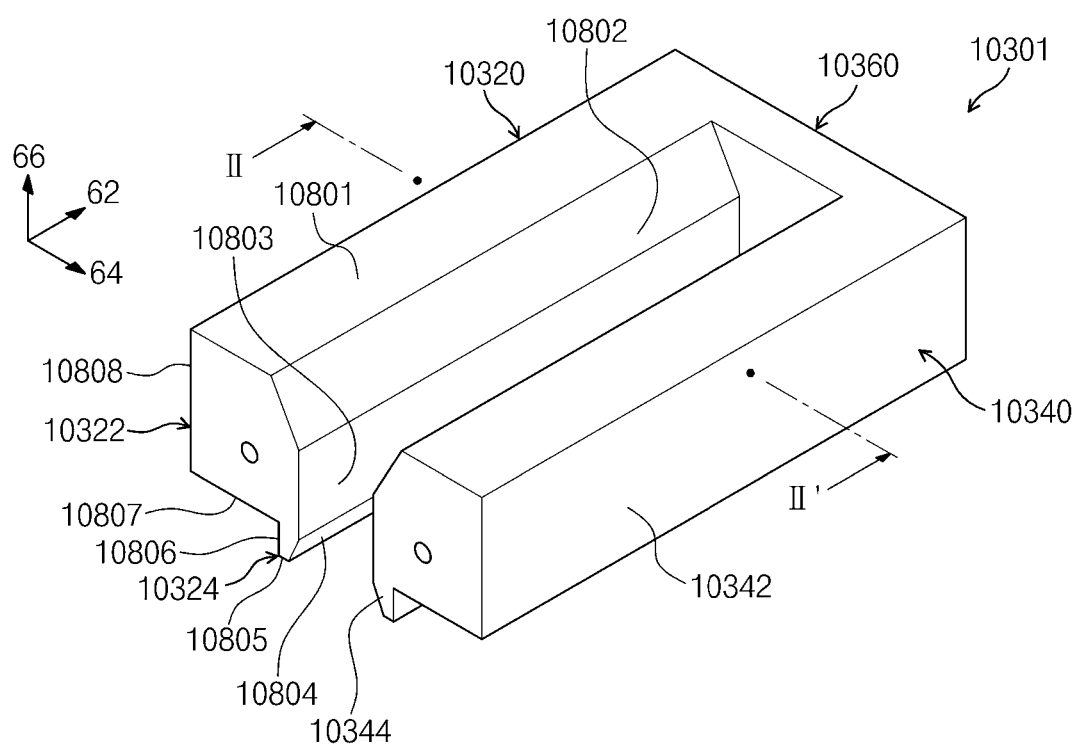
FIG. 30 is a perspective view illustrating a coil according to another embodiment of the present general inventive concept.
Figure 31:
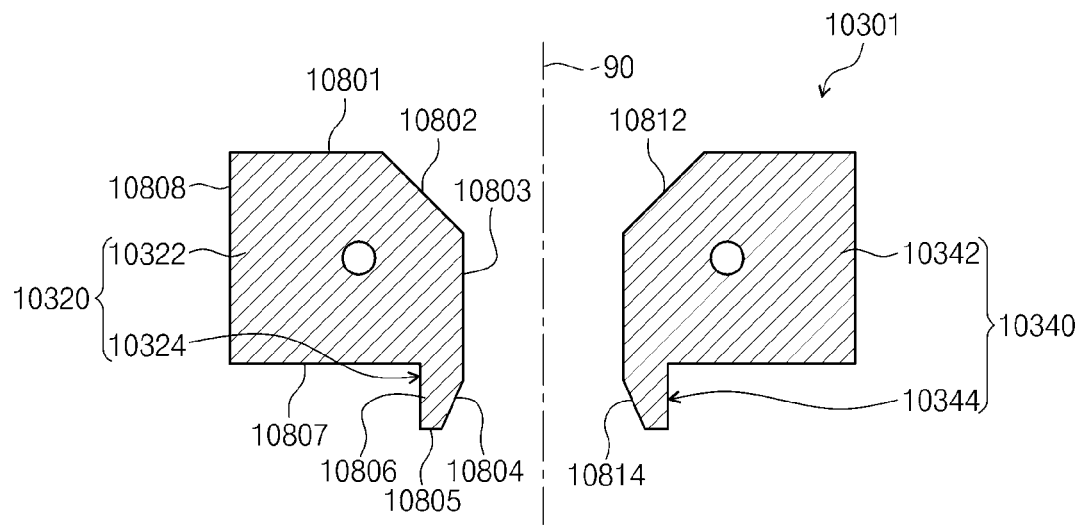
FIG. 31 is a cross-sectional view taken along line II-II' of FIG. 30.

FIG. 30 is a perspective view illustrating a coil 10301 according to another embodiment of the present general inventive concept. FIG. 31 is a cross-sectional view taken along line II-II' of FIG. 30.

Referring to FIGS. 30 and 31, the coil 10301 includes a first body 10320, a second body 10340, and a third body 10360 that are arranged in approximately the same manner as the first through third bodies 5320, 5340, and 5360 of the coil 5301 of FIG. 21. However, cross sections of the first body 10320 and the second body 10340, which are perpendicular to the longitudinal direction of the coil 10301, are different from those of the first and second bodies 5320 and 5340 of the coil 5301 of FIG. 21. The first body 10320 and the second body 10340 have the same shape, and are symmetrical with respect to a plane 90 between the first body 10320 and the second body 10340. Hereinafter, the shape of the first body 10320 will now be described in detail.

The first body 10320 includes a top portion 10322 and a bottom portion 10324, and the second body 10340 includes a top portion 10342 and a bottom portion 10344. A longitudinal direction of the top portion 10322 is approximately parallel to the first direction 62. Cross sections of the top portion 10322 are the same along the first direction 62. The top portion 10322 has an inner region and an outer region. The inner region of the top portion 10322 is adjacent to the second body 10340, and the outer region of the top portion 10322 is distant from the second body 10340. A cross section of the top portion 10322, perpendicular to the first direction 62, has an approximate rectangular shape with a cut inner upper end.

The bottom portion 10324 protrudes downward from the top portion 10322 along the third direction 66. A cross section of the bottom portion 10324, perpendicular to the third direction 66, has a smaller area than that of the top portion 10322. The bottom portion 10324 protrudes downward from the inner region of the top portion 10322. The bottom portion 10324 of the first body 10320 faces the bottom portion 10344 of the second body 10340. A cross section of the bottom portion 10324, perpendicular to the third direction 66, has an approximate rectangular shape that has a cut lower end in a region adjacent to the second body 10340.

The first body 10320 has a top surface 10801, a first inner surface 10802, a second inner surface 10803, a third inner surface 10804, a first bottom surface 10805, a first outer surface 10806, a second bottom surface 10807, and a second outer surface 10808 that are sequentially and continuously arranged clockwise. The first inner surface 10802, the second inner surface 10803, and the third inner surface 10804 face the second body 10340. The top portion 10322 is defined by the top surface 10801, the first inner surface 10802, the second inner surface 10803 or a portion of the second inner surface 10803, the second bottom surface 10807, and the second outer surface 10808. The bottom portion 10324 is defined by the first bottom surface 10805, the first outer surface 10806, and the third inner surface 10804, or by the first bottom surface 10805, the first outer surface 10806, and the third inner surface 10804 and a portion of the second inner surface 10803. The top surface 10801, the first bottom surface 10805, and the second bottom surface 10807 are approximately parallel to each other. The second inner surface 10803, the first outer surface 10806, and the second outer surface 10808 are approximately parallel to each other. The top surface 10801 is approximately perpendicular to the second inner surface 10803. The first inner surface 10802 connects the top surface 10801 to the second inner surface 10803, and is inclined in a distant direction from the second body 10340 from the second inner surface 10803 to the top surface 10801. The third inner surface 10804 connects the second inner surface 10803 to the first bottom surface 10805, and is inclined in the distant direction from the second body 10340 from the second inner surface 10803 to the first bottom surface 10805. Accordingly, a distance between the first body 10320 and the second body 10340 gradually decreases downward, then is constant, and then gradually increases. According to the present embodiment, a distance between the upper end of the first inner surface 10802 of the first body 10320 and the upper end of a first inner surface 10812 of the second body 10340 is greater than a distance between the lower end of the third inner surface 10804 of the first body 10320 and the lower end of a third inner surface 10814 of the second body 10340.

The bottom portion 10324 of the coil 10301 has a length to correspond to the top portion 10322, which is similar to the coil 5301 of FIG. 21. Alternatively, the length of the bottom portion 10324 of the coil 10301 may be smaller than that of the top portion 10322, which is similar to the coil 1301 of FIG. 5. The bottom portion 10324 of the coil 10301 may be provided in plurality. In this case, the bottom portions 10324 may be different or identical in length along the first direction 62 and in length along the third direction 66 from the top portion 10322, which is similar to the coil 2301 of FIG. 11, the coil 3301 of FIG. 14, and the coil 4301 of FIG. 17.

Figure 32:
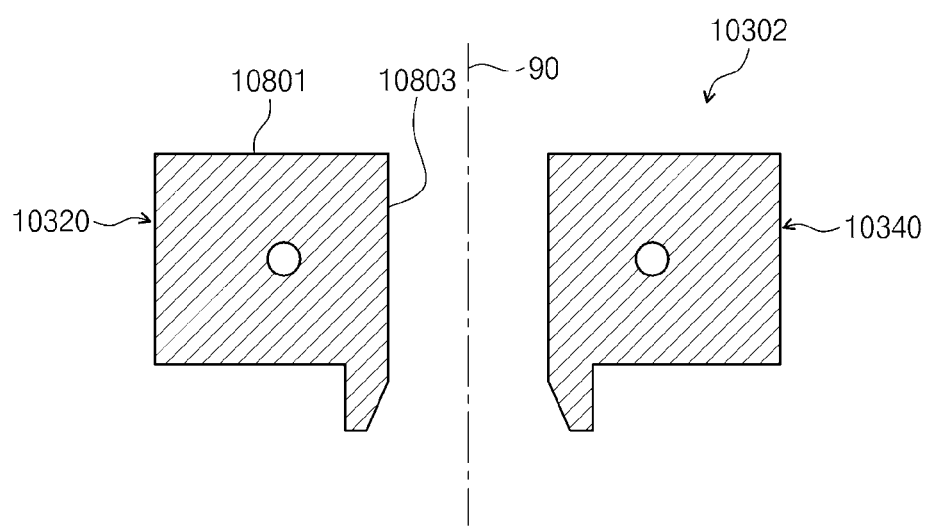
FIGS. 32 through 34 are cross-sectional views illustrating modifications of the coil of FIG. 30.
Figure 33:
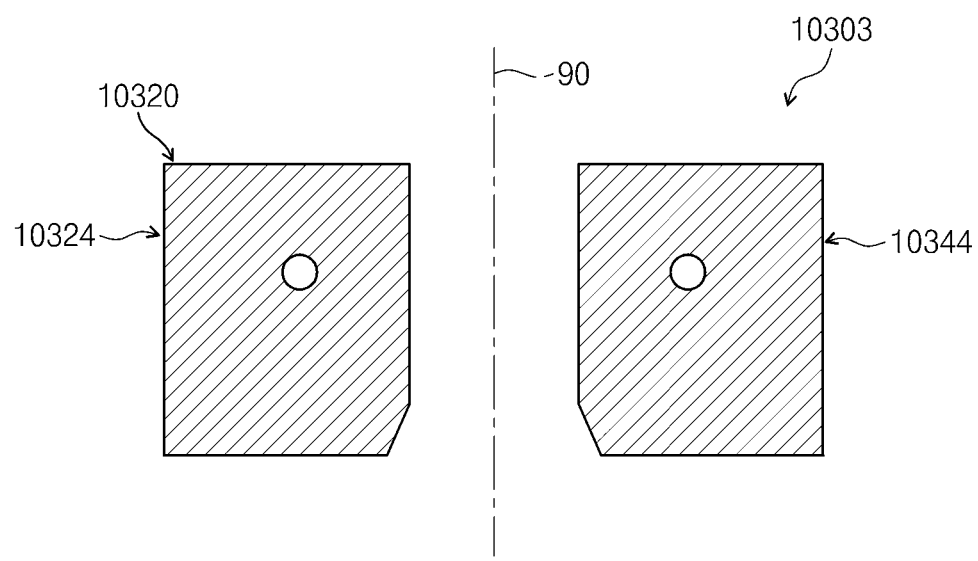
Figure 34:
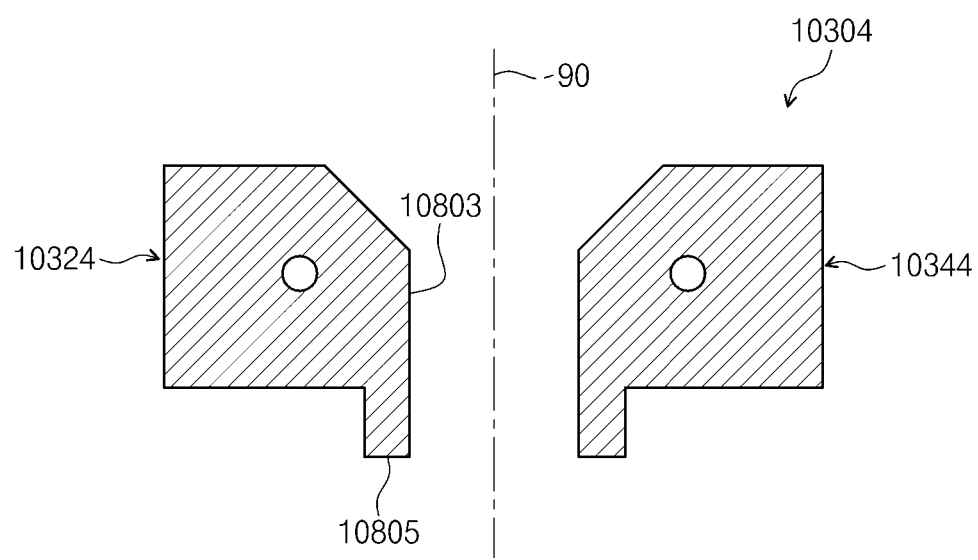

FIGS. 32 through 34 are cross-sectional views illustrating coils 10302, 10303, and 10304 which are modifications of the coil 10301 of FIG. 30. Referring to FIG. 32, in the first body 10320 of the coil 10302, the top surface 10801 is connected directly to the second inner surface 10803 without a first inner surface. Alternatively, referring to FIG. 33, the first body 10320 of the coil 10303 may include only the bottom portion 10324 without a top portion. Alternatively, referring to FIG. 34, the first bottom surface 10805 of the first body 10320 of the coil 10304 may be connected directly to the second inner surface 10803 without a third inner surface.

Although the first inner surface 10802, the second inner surface 10803, and the third inner surface 10804 of the coils 10301, 10302, 10303, and 10304 are planar as illustrated in FIGS. 30 through 34, the first inner surface 10802, the second inner surface 10803, and the third inner surface 10804 may be convex or concave.

Figure 35:
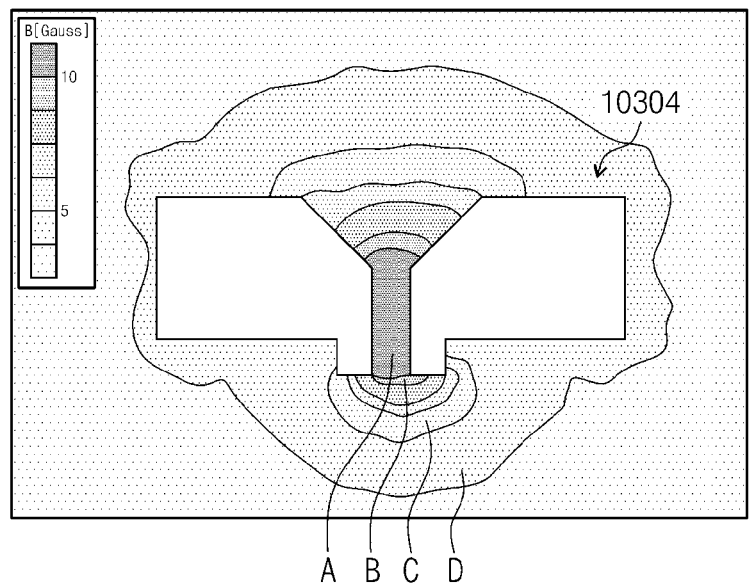
FIG. 35 is a view illustrating the intensity of a magnetic field formed around the coil of FIG. 34.
Figure 36:
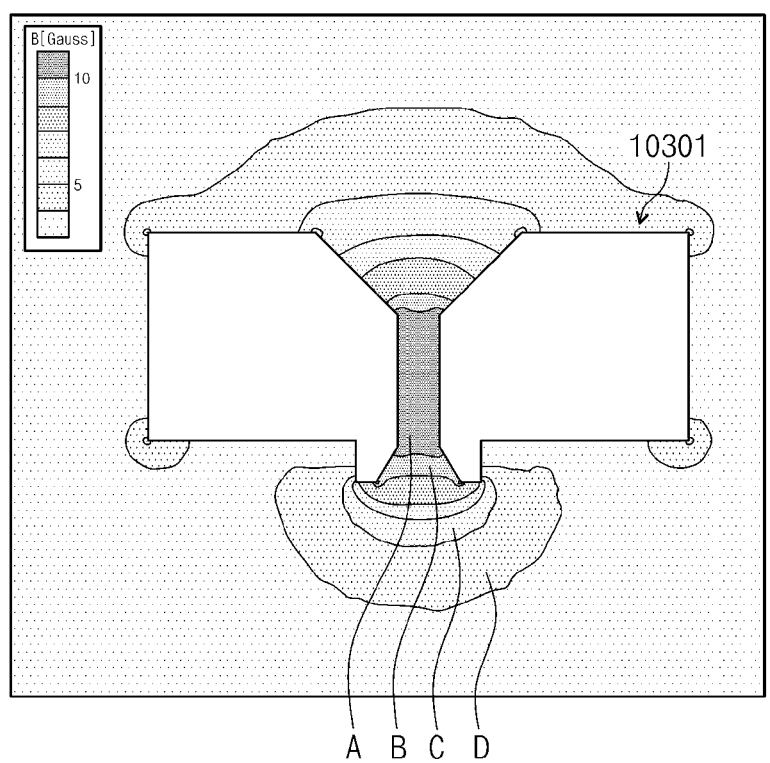
FIG. 36 is a view illustrating the intensity of a magnetic field formed around the coil of FIG. 31.

FIG. 35 is a view illustrating an intensity of a magnetic field formed around the coil 10304 of FIG. 34 when a current is applied to the coil 10304. FIG. 36 is a view illustrating the intensity of a magnetic field formed around the coil 10301 of FIG. 30 when a current is applied to the coil 10301. A magnetic field in a region 'A' was approximately 10 gauss or more, and a magnetic field in a region 'D' was approximately 5 gauss or less. Since the intensity of the magnetic field in the region 'A' was very high, it was difficult to perform a reflow process in the region 'A'. A reflow process was efficiently performed in a region 'B' and a region 'C'. Since the intensity of the magnetic field in the region 'D' was low, the efficiency of a reflow process in the region 'D' was low. However, referring to FIG. 36, since the region 'B' was included in the region between the third inner surface 10804 of the first body 10320 of the coil 10301 and the third inner surface 10814 of the second body 10340, a heating space having high process efficiency was further expanded.

Figure 37:
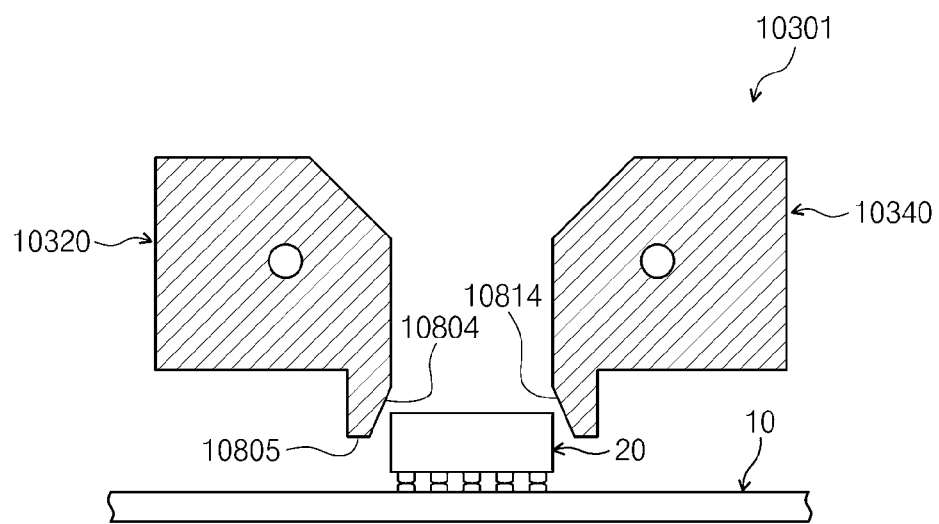
FIGS. 37 and 38 are schematic views illustrating relative positions between the coil of FIG. 31 and an object to be heated when a mounting process is performed using the coil, according to another embodiment of the present general inventive concept.
Figure 38:
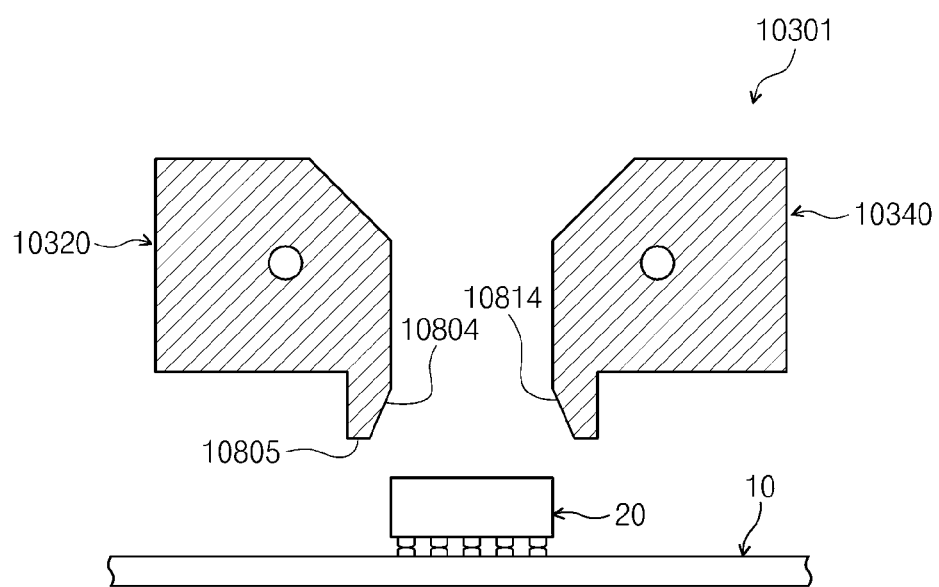

FIGS. 37 and 38 are schematic views illustrating relative positions between the semiconductor chip 20 and the coil 10301 of FIG. 30 placed on the printed circuit board 10 when a reflow process is performed using the coil 10301 in a mounting process. Referring to FIG. 37, a portion of the semiconductor chip 20 may be disposed between the third inner surface 10804 of the first body 10320 and the third inner surface 10814 of the second body 10340 during the reflow process. Alternatively, the entire region the semiconductor chip 20 may be lower than the first bottom surface 10805 of the first body 10320 during the reflow process, as illustrated in FIG. 38.

Figure 39:
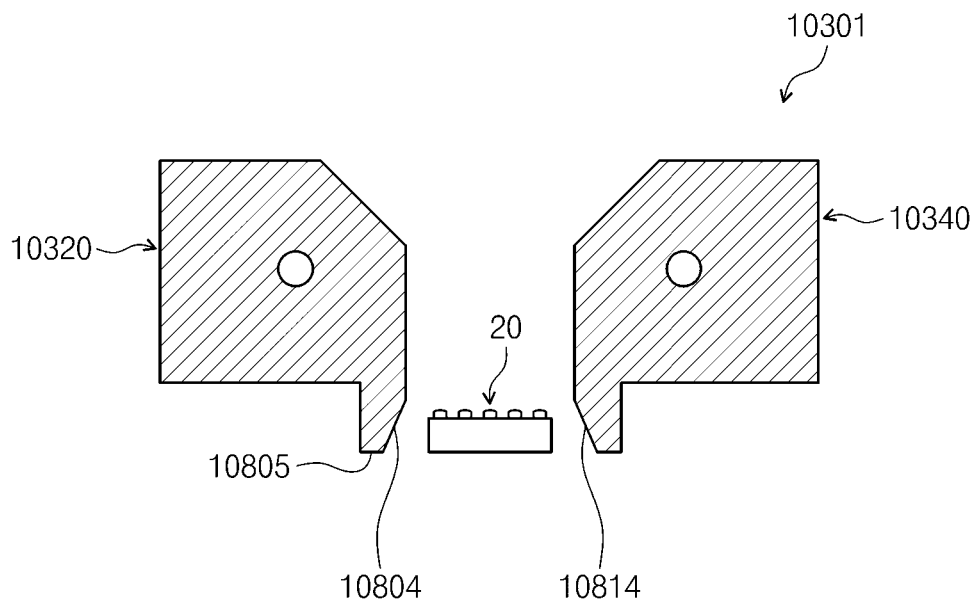
FIGS. 39 through 41 are schematic views illustrating relative positions between the coil of FIG. 31 and an object to be heated when an assembly process is performed using the coil, according to another embodiment of the present general inventive concept.
Figure 40:
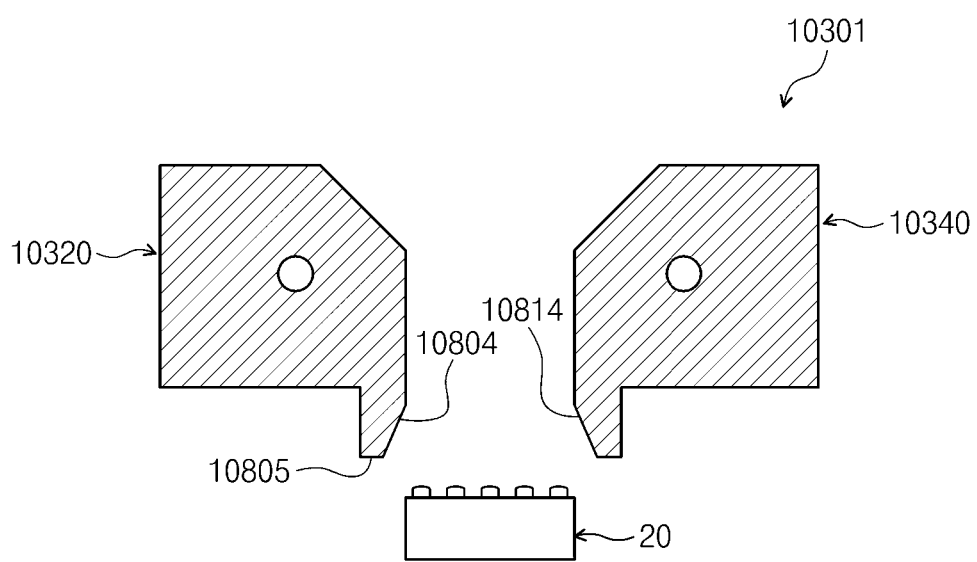
Figure 41:
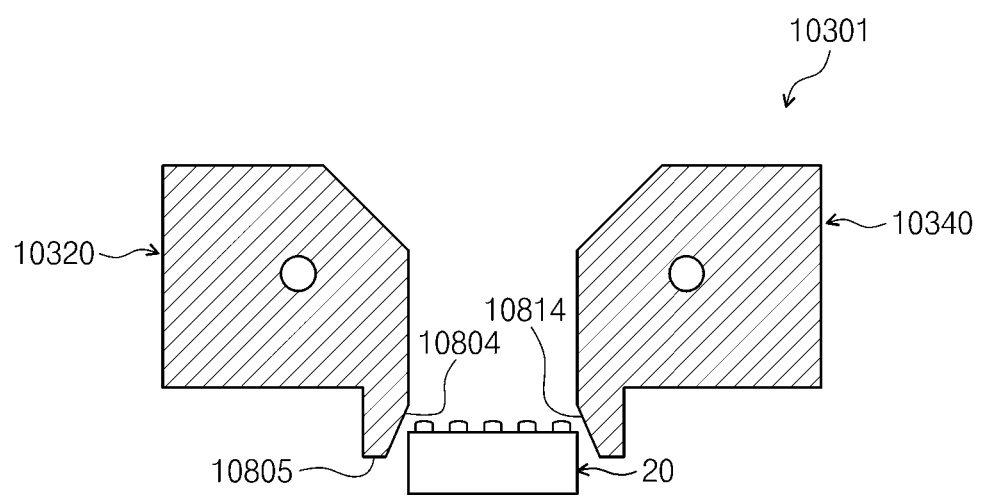

FIGS. 39 through 41 are schematic views illustrating relative positions between the semiconductor chip 20 and the coil 10301 of FIG. 30 when a reflow process is performed using the coil 10301 in an assembly process. Referring to FIG. 39, the entire region of the semiconductor chip 20 may be disposed between the third inner surface 10804 of the first body 10320 and the third inner surface 10814 of the second body 10340. Alternatively, referring to FIG. 40, the entire region of the semiconductor chip 20 may be lower than the first bottom surface 10805 of the first body 10320. Alternatively, referring to FIG. 41, a portion of the semiconductor chip 20 may be disposed between the third inner surface 10804 of the first body 10320 and the third inner surface 10814 of the second body 10340, and the rest of the semiconductor chip 20 may be lower than the first bottom surface 10805 of the first body 10320. Although the single semiconductor chip 20 is exemplified as an object to be heated in FIGS. 39 through 41, a semiconductor chip package including the two semiconductor chips 20 that are vertically stacked may be used as an object to be heated. In this case, one of the semiconductor chips 20 may be disposed between the third inner surface 10804 of the first body 10320 and the third inner surface 10814 of the second body 10340, and the other may be lower than the first bottom surface 10805 of the first body 10320.

Figure 42:
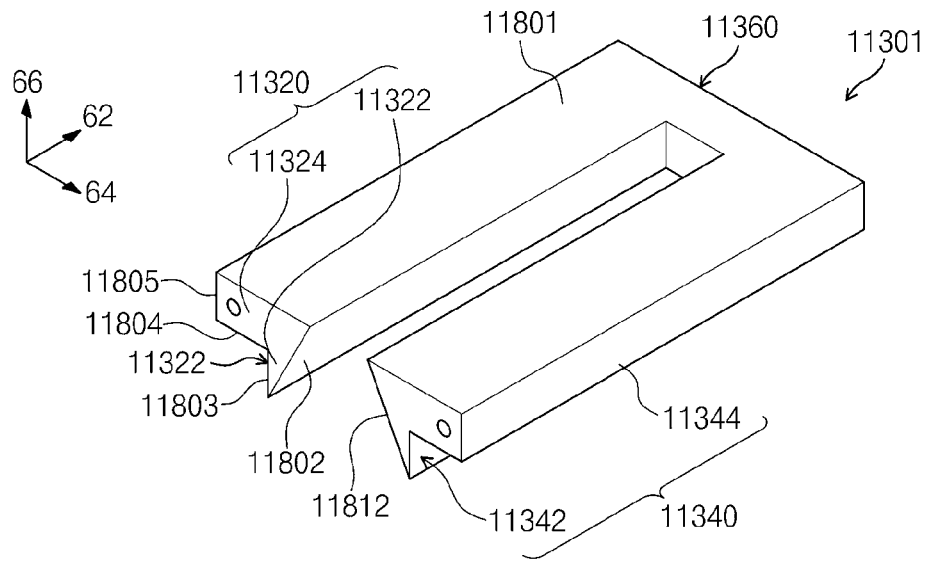
FIG. 42 is a perspective view illustrating a coil according to another embodiment of the present general inventive concept.

FIG. 42 is a perspective view illustrating a coil 11301 according to another embodiment of the present general inventive concept. Referring to FIG. 42, the coil 11301 includes a first body 11320, a second body 11340, and a third body 11360 that are arranged in approximately the same manner as the first body 5320, the second body 5340 and the third body 5360 of the coil 5301 of FIG. 21. However, cross sections of the first and second bodies 11320 and 11340, perpendicular to the longitudinal direction of the coil 11301, are different from those of the first and second bodies 5320 and 5340 of the coil 5301 of FIG. 21. The first and second bodies 11320 and 11340 have the same shape, and are symmetrical with respect to a plane disposed between the first and second bodies 11320 and 11340. Hereinafter, the shape of the first body 11320 will now be described in detail.

The first body 11320 includes a front portion 11322 having a right angled triangle cross section perpendicular to the longitudinal direction of the first body 11320, and a rear portion 11324 having a rectangular cross section perpendicular to the longitudinal direction of the first body 11320. The second body 11340 includes a front portion 11342 having a right angled triangle cross section perpendicular to the longitudinal direction of the second body 11340, and a rear portion 11344 having a rectangular cross section perpendicular to the longitudinal direction of the second body 11340. The front portion 11322 is adjacent to the second body 11340, and the rear portion 11324 extends from the front portion 11322 in a distant direction from the second body 11340. An inclined surface of the front portion 11322 of the first body 11320 is provided as a surface facing the second body 11340, and is gradually distant downward from the second body 11340. The rear portion 11324 is higher than the lower end of the front portion 11322.

The first body 11320 has a top surface 11801, an inner surface 11802, a first outer surface 11803, a bottom surface 11804, and a second outer surface 11805 that are sequentially and continuously arranged clockwise. The inner surface 11802, facing the second body 11340, is the aforementioned inclined surface. The front portion 11322 is defined by a portion of the top surface 11801, the inner surface 11802, and the first outer surface 11803. The rear portion 11324 is defined by the rest of the top surface 11801, the bottom surface 11804, and the second outer surface 11805. The top surface 11801 is approximately parallel to the bottom surface 11804. The first outer surface 11803 is approximately parallel to the second outer surface 11805. The top surface 11801 is approximately perpendicular to the first outer surface 11803. The inner surface 11802 connects the top surface 11801 to the first outer surface 11803, and is inclined from the top surface 11801 to the first outer surface 11803 in the distant direction from the second body 11340. Accordingly, the distance between the first body 11320 and the second body 11340 gradually increases downward. Alternatively, the first body 11320 and the second body 11340 may include only front portions without rear portions.

The entire portions or a portion of the semiconductor chip 20 may be disposed between the inner surface 11802 of the first body 11320 and an inner surface 11812 of the second body 11340, or be lower than the first body 11320.

Figure 43:
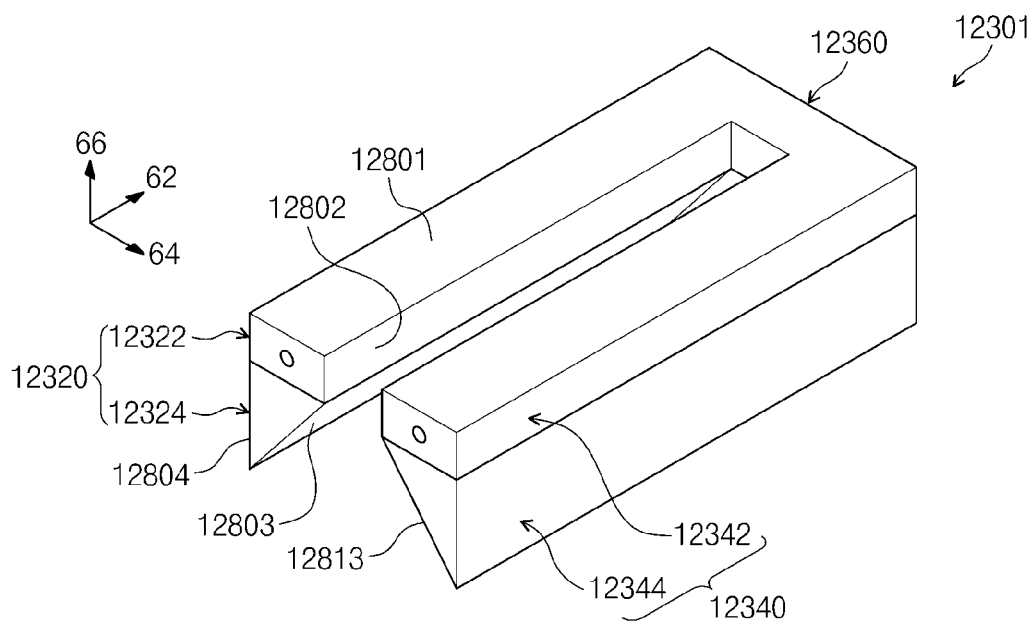
FIG. 43 is a perspective view illustrating a coil according to another embodiment of the present general inventive concept.

FIG. 43 is a perspective view illustrating a coil 12301 according to another embodiment of the present general inventive concept. Referring to FIG. 43, the coil 12301 includes a first body 12320, a second body 12340, and a third body 12360 that are arranged in approximately the same manner as the first body 11320, the second body 11340 and the third body 11360 of the coil 11301 of FIG. 42. However, cross sections of the first body 12320 and the second body 12340, perpendicular to the longitudinal direction of the coil 12301, are different from those of the first body 11320 and the second body 11340 of the coil 11301 of FIG. 42. The first body 12320 and the second body 12340 have the same shape, and are symmetrical with respect to a plane disposed between the first and second bodies 12320 and 12340. Hereinafter, the shape of the first body 12320 will now be described in detail.

The first body 12320 includes a top portion 12322 having a rectangular cross section perpendicular to the longitudinal direction of the first body 12320, and a bottom portion 12324 having a right angled triangle cross section perpendicular to the longitudinal direction of the first body 12320. The second body 12340 includes a top portion 12342 having a rectangular cross section perpendicular to the longitudinal direction of the second body 12340, and a bottom portion 12344 having a right angled triangle cross section perpendicular to the longitudinal direction of the second body 12340. The bottom portion 12324 extends downward from the bottom surface of the front portion 12322. An inclined surface of the bottom portion 12324 of the first body 12320 is provided as a surface facing the second body 12340, and is gradually distant downward from the second body 12340.

The first body 12320 has a top surface 12801, a first inner surface 12802, a second inner surface 12803, and an outer surface 12804 that are sequentially and continuously arranged clockwise. The first and second inner surfaces 12802 and 12803 face the second body 12340. The top portion 12322 is defined by the top surface 12801, the first inner surface 12802, and a portion of the outer surface 12804. The bottom portion 12324 is defined by the second inner surface 12803 and the rest of the outer surface 12804. The first inner surface 12802 is approximately parallel to the outer surface 12804. The top surface 12801 is approximately perpendicular to the outer surface 12804. The second inner surface 12803 connects the first inner surface 12802 to the outer surface 12804, and is inclined from the first inner surface 12802 to the outer surface 12804 in a distant direction from the second body 12840. Accordingly, the distance between the first body 12320 and the second body 12340 gradually increases downward.

The entire portions or a portion of the semiconductor chip 20 may be disposed between the second inner surface 12803 of the first body 12320 and a second inner surface 12813 of the second body 12340 or be lower than the first body 12320.

According to the present general inventive concept, a package process can be efficiently performed.

Additionally, according to the present general inventive concept, a time consumed for a package process can be shortened and thus a processing speed can be improved.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A heating member to heat solder balls of a semiconductor chip to reflow the solder ball, the heating member comprising:
   a power source to provide heat to the heating member;
   a cooling line to cool the heating member; and
   a coil, the coil comprising:
      a main body having a top surface and a bottom surface that are parallel to each other, and an inner surface provided between the top surface and the bottom surface and perpendicular to the top and bottom surfaces,
   wherein the bottom surface includes a plurality of bottom portions spaced apart from each other, each of the bottom portions to protrude in a downward direction from the bottom surface.

2. The heating member as claimed in claim 1, wherein at least two of the bottom portions have downward protruding lengths that are different from each other.

3. The heating member as claimed in claim 1, wherein at least two of the bottom portions have widths that are different from each other.

4. A heating member to heat solder balls of a semiconductor chip to reflow the solder ball, the heating member comprising:
   a power source to provide heat to the heating member;
   a cooling line to cool the heating member; and
   a coil, the coil comprising:
      a main body having a top surface and a bottom surface that are parallel to each other, and an inner surface provided between the top surface and the bottom surface and perpendicular to the top and bottom surfaces,
   wherein the inner surface includes an inclined portion, a middle portion, and a declined portion, the inclined portion being gradually inclined in an upward direction from the bottom surface toward the top surface, the middle portion being provided between the inclined portion and the declined portion and perpendicular to the top and bottom surfaces, and the declined portion being gradually declined in a downward direction from the middle portion to a lower protruding end of the bottom surface.

* * * * *